(12) United States Patent
La et al.

(10) Patent No.: US 12,615,724 B2
(45) Date of Patent: Apr. 28, 2026

(54) FLEXIBLE DISPLAY DEVICE WITH SETTLED COVER LAYER

(71) Applicant: SAMSUNG DISPLAY CO., LTD., Yongin-si (KR)

(72) Inventors: Sojeong La, Yongin-si (KR); Suchang Ryu, Yongin-si (KR); Young-Min Park, Yongin-si (KR); Dohun Kim, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 220 days.

(21) Appl. No.: 18/521,806

(22) Filed: Nov. 28, 2023

(65) Prior Publication Data

US 2024/0284609 A1      Aug. 22, 2024

(30) Foreign Application Priority Data

Feb. 21, 2023     (KR) ........................ 10-2023-0022684

(51) Int. Cl.
*H05K 5/02* (2006.01)
(52) U.S. Cl.
CPC .................................... *H05K 5/02* (2013.01)
(58) Field of Classification Search
CPC ........ G06F 1/16; G06F 1/1601; G06F 1/1613;
G06F 1/1616; G06F 1/1618; G06F
1/1637; G06F 1/1641; G06F 1/1643;
G06F 1/1652; H05K 5/02
USPC .................................................... 361/681, 807
See application file for complete search history.

(56) References Cited

U.S. PATENT DOCUMENTS

| 10,930,883 | B2 * | 2/2021 | Park ...................... H05K 5/0017 |
| 2020/0319672 | A1 * | 10/2020 | Kim .................... H04M 1/0268 |
| 2022/0397934 | A1 | 12/2022 | La et al. |

FOREIGN PATENT DOCUMENTS

| KR | 10-2305912 | 9/2021 |
| KR | 10-2022-0167844 | 12/2022 |

* cited by examiner

*Primary Examiner* — Imani N Hayman
*Assistant Examiner* — Ross Terry Mularski
(74) *Attorney, Agent, or Firm* — F. Chau & Associates, LLC

(57) ABSTRACT

A display device includes a display panel and a support plate disposed below the display panel, the support plate including a first flat part, a second flat part, and a central or folding part disposed between the first and second flat parts. The folding part may have a thickness different than each of the first and second flat parts.

20 Claims, 16 Drawing Sheets

FLEXIBLE DISPLAY DEVICE WITH SETTLED COVER LAYER

CROSS-REFERENCE

This U.S. non-provisional patent application claims priority under 35 U.S.C. § 119 to Korean Patent Application No. 10-2023-0022684, filed on Feb. 21, 2023, the entire disclosure of which is hereby incorporated by reference.

FIELD

The present disclosure generally relates to display technology, and more particularly relates to a flexible display device with settled cover layer.

DISCUSSION

Electronic equipment for providing an image to a user, such as smartphones, digital cameras, laptop computers, navigational devices, and smart televisions, generally include a display device for displaying an image. The display device generates an image to provide the image to a user through a display screen. Various types of display devices are under development. For example, display devices that may be flexed or deformed into a curved shape, folded, and/or rolled are being developed. Some flexible display devices may be conveniently carried.

SUMMARY

The present disclosure provides a display device with high impact resistance that provides resistance to external impacts. Wrinkles of a display panel may be visually recognized by a user to improve surface quality.

An embodiment of the inventive concept provides a display device including: a display panel; and a support plate disposed below the display panel, the support plate including a first flat part, a second flat part, and a folding part disposed between the first and second flat parts, wherein the folding part has a thickness different than each of the first and second flat parts.

An embodiment of the inventive concept provides a display device including a display panel; a support plate disposed below the display panel, the support plate including a first flat part, a second flat part, and a central part disposed between the first and second flat parts; and a first cover layer disposed in a first folding groove defined in a bottom surface of the support plate overlapping the central part.

An embodiment of the inventive concept provides a display device including a display panel and a support plate disposed under the display panel. A plurality of openings may be defined in the support plate. The display device may include at least one cover layer over the openings. The at least one cover layer may be settled into the support plate. A folding segment of the support plate comprises an etched space for the at least one cover layer to settle.

BRIEF DESCRIPTION OF THE DRAWINGS

The accompanying drawings are included to provide further understanding of the inventive concept, and are incorporated in and constitute a part of this disclosure. The drawings illustrate embodiments of the inventive concept and, together with the description, serve to explain principles of the inventive concept. In the drawings.

DETAILED DESCRIPTION

Figure 1:
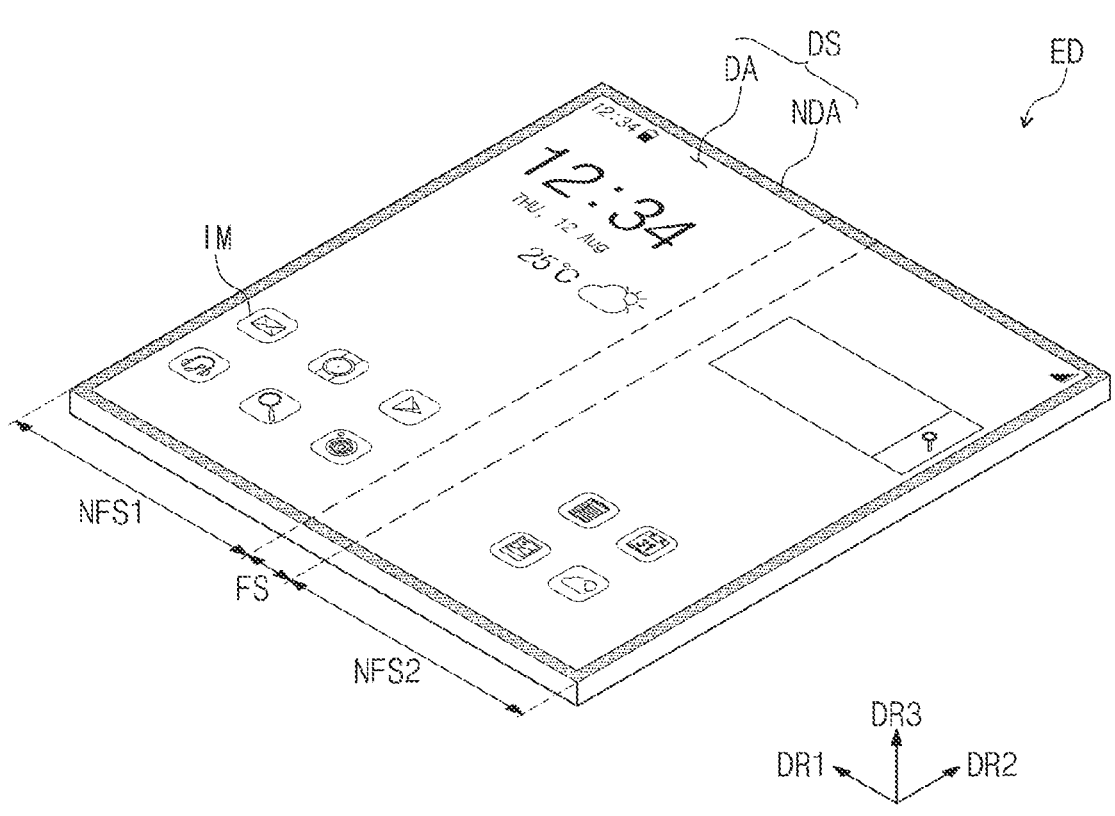
FIG. 1 is a perspective view diagram of an electronic apparatus according to an embodiment of the inventive concept.

Embodiments of the present inventive concept, including implementation methods thereof, will be disclosed by way of example through the following illustrative embodiments as described with reference to the accompanying drawings. The present inventive concept may, however, be embodied in different forms and should not be construed as limited to the illustrative embodiments set forth herein. Rather, these embodiments are provided so that the present disclosure shall be thorough and complete, and shall fully convey the scope of the present inventive concept to those of ordinary skill in the pertinent art. The present inventive concept is defined by the scopes of the appended claims. Like reference numerals may refer to like elements throughout.

It shall be understood that when a layer is referred to as being "on" another element, layer or substrate, it can be directly on the other layer or substrate, or intervening elements, layers or substrates may also be present. In contrast, when an element is referred to as being "directly on" another element, layer or substrate, there are no intervening elements, layers or substrates present. As used herein, the term "and/or" includes any or all combinations of one or more of the associated listed items.

Spatially relative terms, such as "below", "beneath", "lower", "above", "upper" and the like, may be used herein for ease of description to describe one element or feature's relationship to another element or feature as illustrated in the drawings. The spatially relative terms should be understood as terms which include different directions of elements in addition to directions illustrated in the drawings when using or operating embodiments of the present inventive concept. Like reference numerals may refer to like elements throughout.

It shall be understood that although the terms of first and second are used herein to describe various elements and/or sections, such elements and/or sections shall not be limited by these terms. These terms are used to distinguish one element, component, or section from another element, component, or section. Accordingly, a first element, a first component, or a first section that shall be described below may be a second element, a second component, or a second section within the technical idea of the present inventive concept.

Embodiments set forth in the detailed description may be described with schematic cross-sectional views and/or plan views as illustrative views of the present inventive concept. Accordingly, shapes of the illustrative views may be modified according to manufacturing techniques and/or allowable errors. Therefore, embodiments of the present inventive concept are not limited to the specific shape illustrated in the drawings, but may include other shapes that may be created according to manufacturing processes. Areas exemplified in the drawings have general properties, and are used to illustrate a specific shape of a semiconductor package region. Thus, this should not be construed as limited to the scope of the present inventive concept.

Hereinafter, illustrative embodiments of the present inventive concept will be described in greater detail with reference to the accompanying drawings.

Figure 2A:
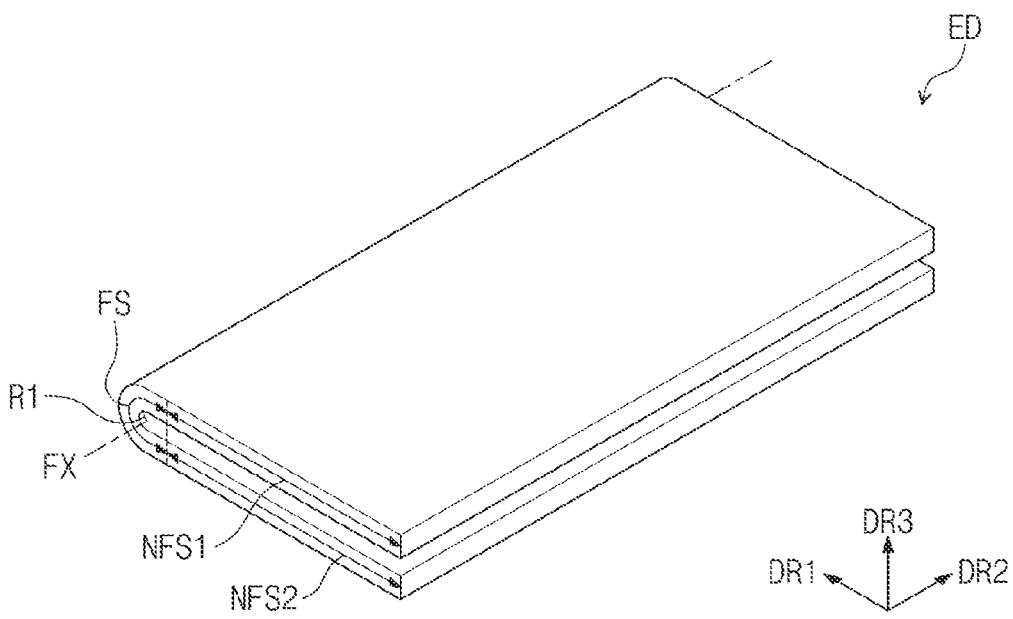
FIGS. 2A and 2B are perspective view diagrams illustrating a folded state of the electronic apparatus of FIG. 1.
Figure 2B:
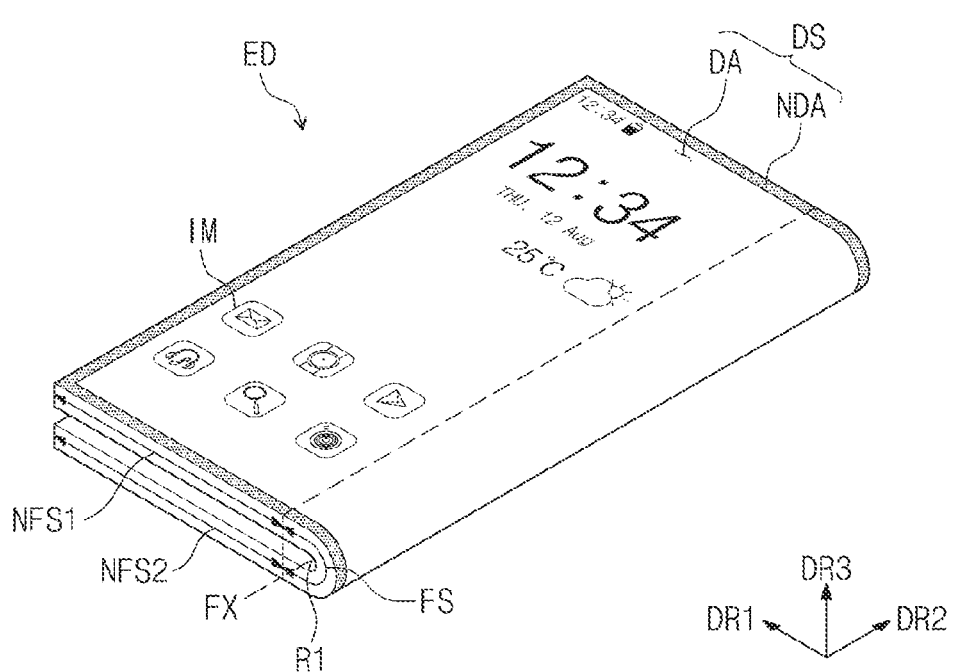

FIG. 1 illustrates an electronic apparatus according to an embodiment of the inventive concept. FIGS. 2A and 2B illustrate a folded state of the electronic apparatus of FIG. 1.

Referring to FIG. 1, an electronic apparatus ED according to an embodiment of the inventive concept has a rectangular shape having short sides extending in a first direction DR1 and long sides extending in a second direction DR2 crossing the first direction DR1. However, embodiments of the inventive concept are not limited thereto. For example, the electronic apparatus ED may have various shapes such as a circular shape, a polygonal shape, and/or the like. The electronic apparatus ED may be flexible.

Hereinafter, a direction substantially normal to a plane defined by the first direction DR1 and the second direction DR2 is defined as a third direction DR3. Moreover, In this specification, the phrase "viewed from the plane" may be defined as a state when viewed in the third direction DR3.

The electronic apparatus ED may include a folding segment FS1 and a plurality of non-folding segments NFS1 NFS2. The non-folding segments NFS1 NFS2 may include a first non-folding segment NFS1 and a second non-folding segment NFS2. The folding segment FS may be disposed between the first non-folding segment NFS1 and the second non-folding segment NFS2. The folding segment FS, the first non-folding segment NFS1, and the second non-folding segment NFS2 may be arranged in the first direction DR1.

Although one folding segment FS and two non-folding segments NFS1 and NFS2 are illustrated, embodiments of the inventive concept are not limited thereto. The number of folding segments FS and the number of non-folding segments NFS1 and NFS2 are not limited thereto. For example, the electronic apparatus ED may include more than two non-folding segments and a plurality of folding segments between the non-folding segments.

A top surface of the electronic apparatus ED may be defined as a display surface DS and have a plane defined by the first direction DR1 and the second direction DR2. For example, images IM generated in the electronic apparatus ED may be provided to a user through the display surface DS.

The display surface DS may include a display area DA and a non-display area NDA around the display area DA. An image may be displayed on the display area DA, but need not be displayed on the non-display area NDA. The non-display area NDA may surround the display area DA and define an edge of the electronic apparatus ED, which is printed with a predetermined color.

Referring to FIGS. 2A and 2B, the electronic apparatus ED may be a folding-type or foldable electronic apparatus that is capable of being folded or unfolded. For example, the folding segment FS may be bent with respect to a folding axis FX parallel to the second direction DR2, and thus, the electronic apparatus ED may be folded. The folding axis FX may be defined as a long axis that is parallel to the long side of the electronic apparatus ED. When folding the electronic apparatus ED, the first non-folding segment NFS1 and the second non-folding segment NFS2 may face each other, and the electronic apparatus ED may be in-folded with a first radius R1 of the folding segment FS about the folding axis FX to prevent the display surface DS from being exposed to the outside. However, embodiments of the inventive concept are not limited thereto. For example, as illustrated in FIG. 2B, the electronic apparatus ED may be out-folded with substantially the same first radius R1 of the folding segment FS about the folding axis FX so that the display surface DS is exposed to the outside with respect to the folding axis FX. In addition, some segments of the electronic apparatus ED may be in-folded and others out-folded at substantially the same time.

Figure 3:
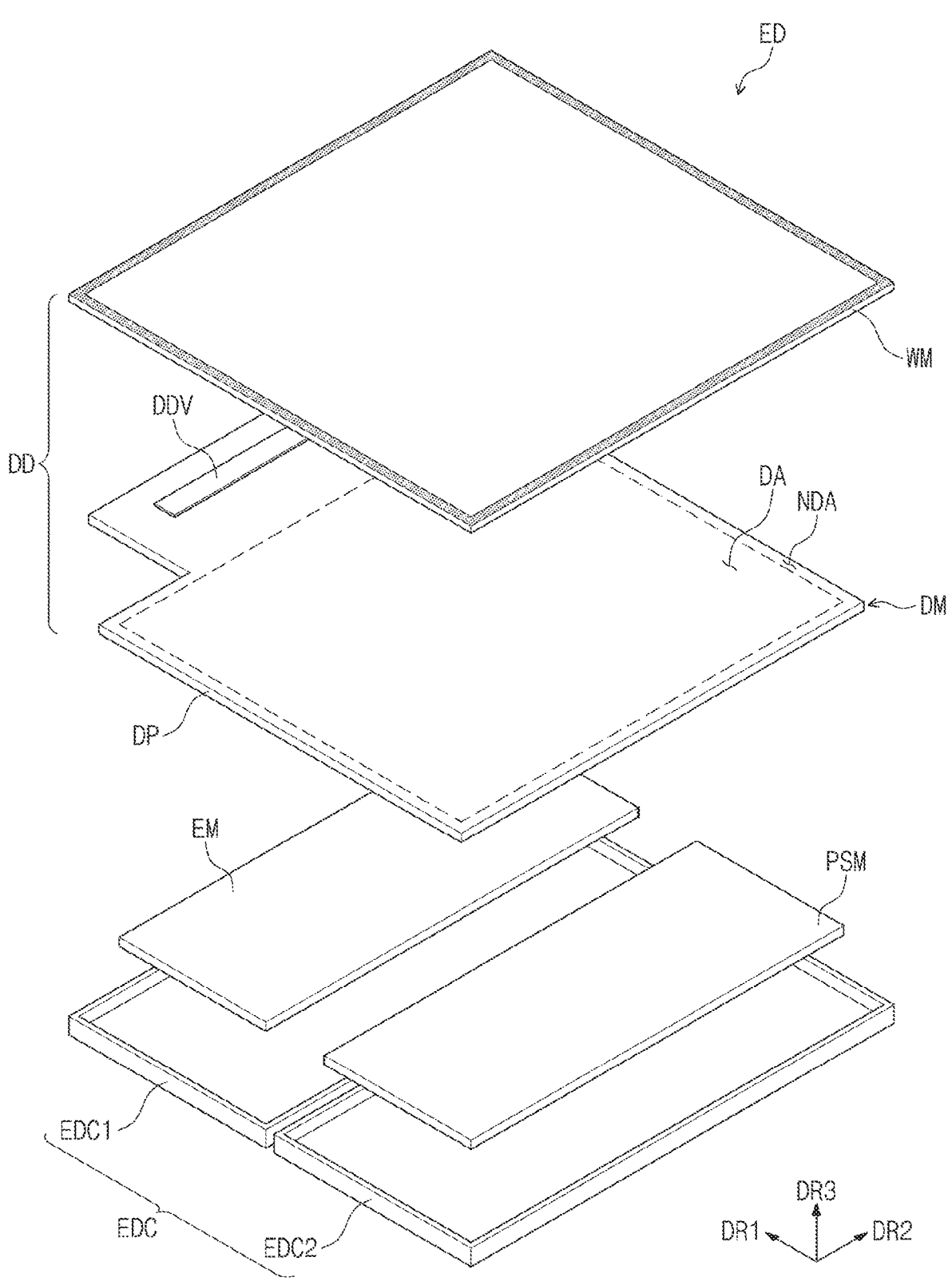
FIG. 3 is an exploded perspective view diagram of the electronic apparatus of FIG. 1.

FIG. 3 illustrates the electronic apparatus of FIG. 1 in greater detail.

Referring to FIG. 3, the electronic apparatus ED may include a display device DD, an electronic module EM, a power supply module PSM, and a case EDC. The electronic apparatus ED may further include a mechanical structure such as a hinge controlling a folding operation of the display device DD.

The display device DD may generate an image and sense an external input. The display device DD may include a window module WM and a display module DM. The window module WM may provide a front surface of the electronic apparatus ED. The window module WM may be disposed on the display module DM to protect the display module DM. The window module WM may transmit light generated in the display module DM and provide the light to the user.

The display module DM may include at least a display panel DP. Although mainly the display panel DP among the laminated structure of the display module DM is illustrated in FIG. 3, the display module DM may further include a plurality of components disposed above and/or below the display panel DP. A detailed laminated structure of the display module DM may be described in greater detail below. The display panel DP may include a display area DA and a non-display area NDA corresponding to the display area DA and non-display area NDA of the electronic apparatus ED of FIG. 1.

The display module DM may include a data driver DDV disposed on the non-display area NDA of the display panel DP. The data driver DDV may be manufactured in the form of an integrated circuit chip and mounted on the non-display panel NDA. However, embodiments of the inventive concept are not limited thereto. For example, the data driver DDV may be mounted on a flexible circuit board connected to the display panel DP.

The electronic module EM and the power supply module PSM may be disposed under the display device DD. The electronic module EM and the power supply module PSM may be connected to each other through a separate flexible circuit board. The electronic module EM may control an operation of the display device DD. The power supply module PSM may supply power to the electronic module EM.

The case EDC may accommodate the display device DD, the electronic module EM, and the power supply module PSM. The case EDC may include two first and second cases EDC1 and EDC2 that fold the display module DM. The first and second cases EDC1 and EDC2 may extend in the second direction DR2 and may be arranged in the first direction DR1.

The electronic apparatus ED may further include a hinge structure that connects the first and second cases EDC1 and EDC2 to each other. The case EDC may be coupled to the window module WM. The case EDC may protect the display device DD, the electronic module EM, and the power supply module PSM.

Figure 4:
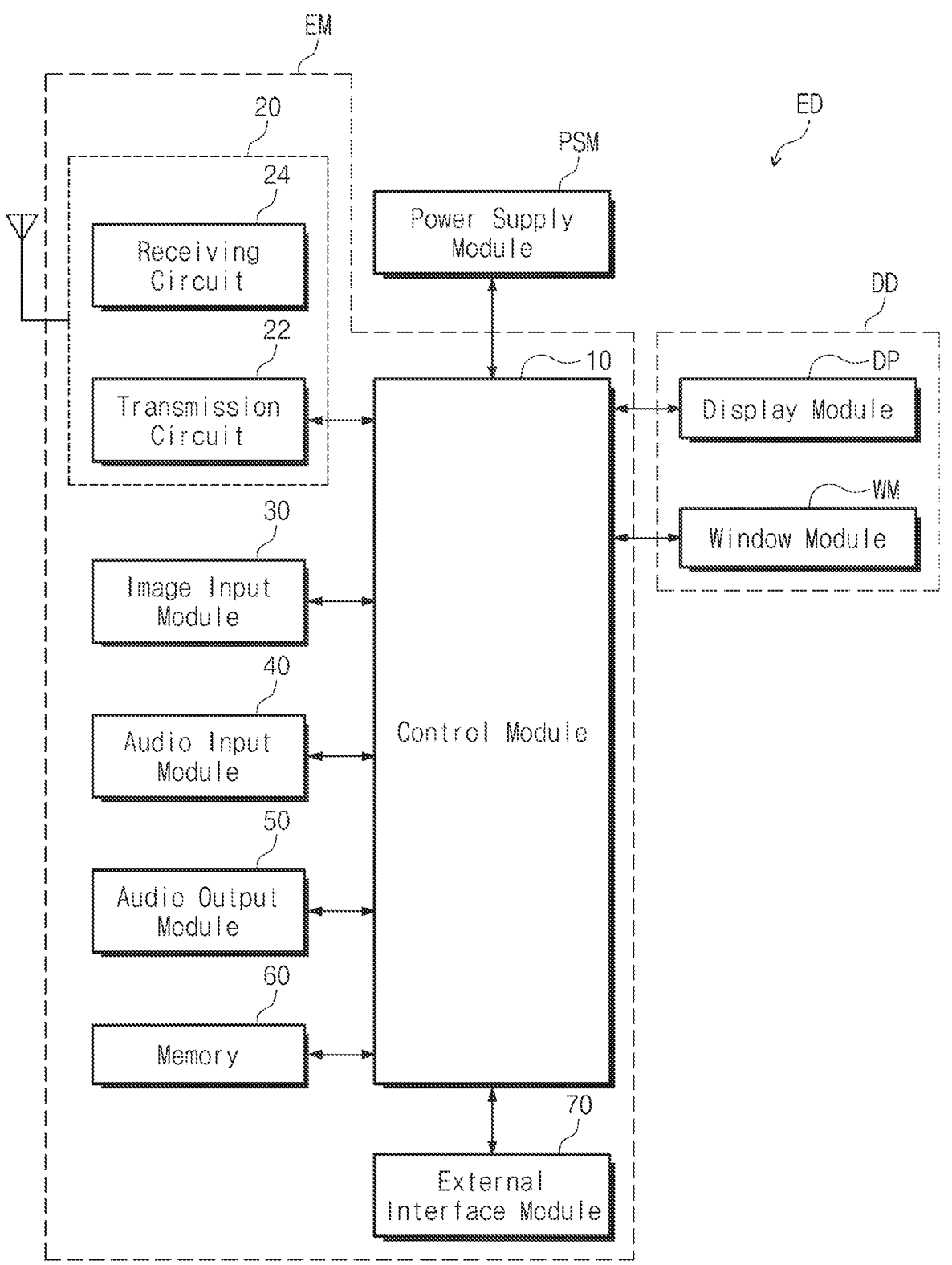
FIG. 4 is a block diagram of a display module of FIG. 3.

FIG. 4 illustrates a display module of FIG. 3 in greater detail.

Referring to FIG. 4, the electronic apparatus ED may include an electronic module EM, a power supply module PSM, and a display device DD. The electronic module EM may include a control module 10, a wireless communications module 20, an image input module 30, an audio input module 40, an audio output module 50, a memory 60, and an external interface module 70. Each of the modules may include a respective circuit, without limitation thereto. For example, some modules' circuits may be combined with other modules' circuits. The modules may be mounted on the circuit board or may be electrically connected to each other through the flexible circuit board. The electronic module EM may be electrically connected to the power supply module PSM.

The control module 10 may control an overall operation of the electronic apparatus ED. For example, the control module 10 may activate or deactivate the display device DD according to a user input. The control module 10 may control the image input module 30, the audio input module 40, the audio output module 50, and/or the like in accordance with the user input. The control module 10 may include at least one microprocessor.

The wireless communications module 20 may transmit and/or receive a wireless signal to and/or from the other terminal by using Bluetooth or Wi-Fi or the like, without limitation thereto. The wireless communications module 20 may transmit and/or receive an audio signal by using a general communications line and/or channel. The wireless communications module 20 includes a transmission circuit 22 for modulating and transmitting a signal to be transmitted and a receiving circuit 24 for demodulating the received signal.

The image input module 30 may process the image signal to convert the processed image signal into image data that is capable of being displayed on the display device DD. The audio input module 40 may receive external audio signals by using a microphone in a recording mode and/or in a voice recognition mode to convert the received audio signal into electrical sound data. The audio output module 50 may convert audio data received from the wireless communications module 20 or audio data stored in the memory 60 to output the converted audio data to the outside.

The external interface module 70 may serve as an interface connected to an external charger, a wired and/or wireless data port, and/or a card socket such as for a memory card and/or a Subscriber Identity Module (SIM) and/or User Identity Module (UIM) card.

The power supply module PSM may supply power required for an overall operation of the electronic apparatus ED. The power supply module PSM may include a typical battery device or the like.

Figure 5:
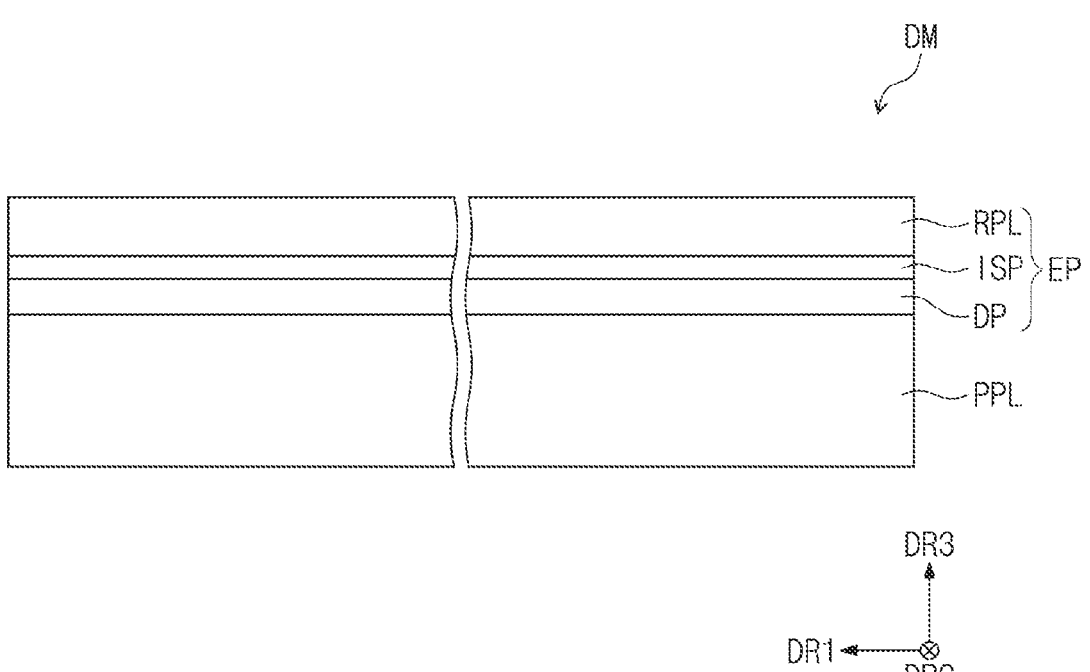
FIG. 5 is a schematic cross-sectional view diagram of the display module of FIG. 4.

FIG. 5 illustrates the display module illustrated in FIG. 4 in greater detail.

Referring to FIG. 5, the display module DM may include a display panel DP, an input sensing part ISP disposed on the display panel DP, an anti-reflection layer RPL disposed on the input sensing part ISP, and a panel protective layer PPL disposed under the display panel DP. The display panel DP may be a flexible display panel. For example, the display panel DP may include a flexible substrate and a plurality of elements disposed on the flexible substrate.

The display panel DP according to an embodiment of the inventive concept may be an emission type display panel, but is not limited thereto. For example, the display panel DP may be an organic light-emitting display panel or an inorganic light-emitting display panel. An emission layer of the organic light-emitting display panel may include an organic light-emitting material. An emission layer of the inorganic light-emitting display panel may include a quantum dot, a quantum rod, and/or the like. Hereinafter, the display panel DP is described as an organic light-emitting display panel.

The input sensing part ISP may include a plurality of sensing parts that sense an external input in a capacitive manner. The input sensing part ISP may be disposed directly on the display panel DP when the display module DM is manufactured.

The anti-reflection layer RPL may be disposed on the input sensing part ISP. The anti-reflection layer RPL may be directly disposed on the input sensing part ISP when the display module DM is manufactured. The anti-reflection layer RPL may be defined as or by an external light anti-reflection film. The anti-reflection layer RPL may reduce reflectance of external light incident from the display device DD onto the display panel DP.

For example, the input sensing part ISP may be directly disposed on the display panel DP, and the anti-reflection layer RPL may be directly disposed on the input sensing part ISP, but embodiments of the inventive concept are not limited thereto. For example, the input sensing part ISP may be separately manufactured and attached to the display panel DP using an adhesive layer, and/or the anti-reflection layer RPL may be separately manufactured and attached to the input sensing part ISP using an adhesive layer.

The display panel DP, the input sensing part ISP, and the anti-reflection layer RPL may be collectively defined as the electronic panel EP.

The panel protective layer PPL may be disposed below the display panel DP. The panel protective layer PPL may protect a lower portion of the display panel DP. The panel protective layer PPL may include a flexible plastic material. For example, the panel protective layer PPL may include polyethylene terephthalate (PET) or the like.

Figure 6:
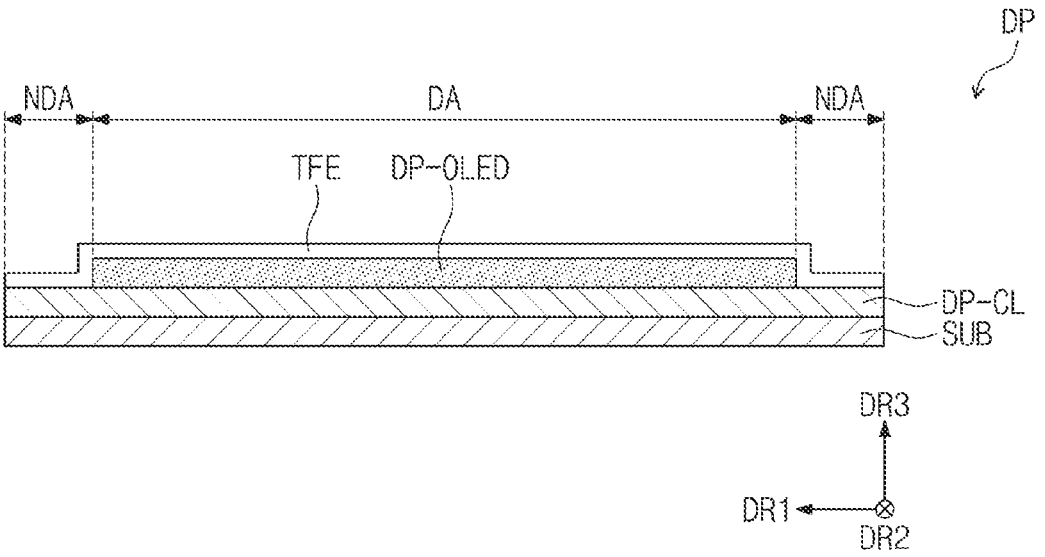
FIG. 6 is a cross-sectional view diagram illustrating an example of a display panel of FIG. 5.

FIG. 6 illustrates a non-limiting example of the display panel of FIG. 5 in greater detail.

In particular, FIG. 6 illustrates a cross-sectional view of the display panel DP when viewed in the second direction DR2.

Referring to FIG. 6, the display panel DP may include a substrate SUB, a circuit element layer DP-CL disposed on the substrate SUB, and a display element layer DP-OLED disposed on the circuit element layer DP-CL, and a thin film encapsulation layer TFE disposed on the display element layer DP-OLED and the circuit element layer DP-CL.

The display panel DP may include a display area DA and a non-display area NDA around the display area DA. The substrate SUB may include glass or a flexible plastic material such as polyimide (PI). The display element layer DP-OLED may be disposed on the display area DA. The thin film encapsulation layer TFE may be disposed on the display element layer DP-OLED in the display area DA and on the circuit element layer DP-CL in the non-display area NDA.

A plurality of pixels may be disposed on the circuit element layer DP-CL and the display element layer DP-OLED. Each of the pixels may include a transistor disposed on the circuit element layer DP-CL and a light-emitting element disposed on the display element layer DP-OLED and connected to the transistor. Components of the pixel may be described with respect to FIG. 7 in greater detail.

The thin film encapsulation layer TFE may be disposed on the circuit element layer DP-CL to cover the display element layer DP-OLED. The thin film encapsulation layer TFE may protect the pixels from moisture, oxygen, external foreign substances, and/or the like.

Figure 7:
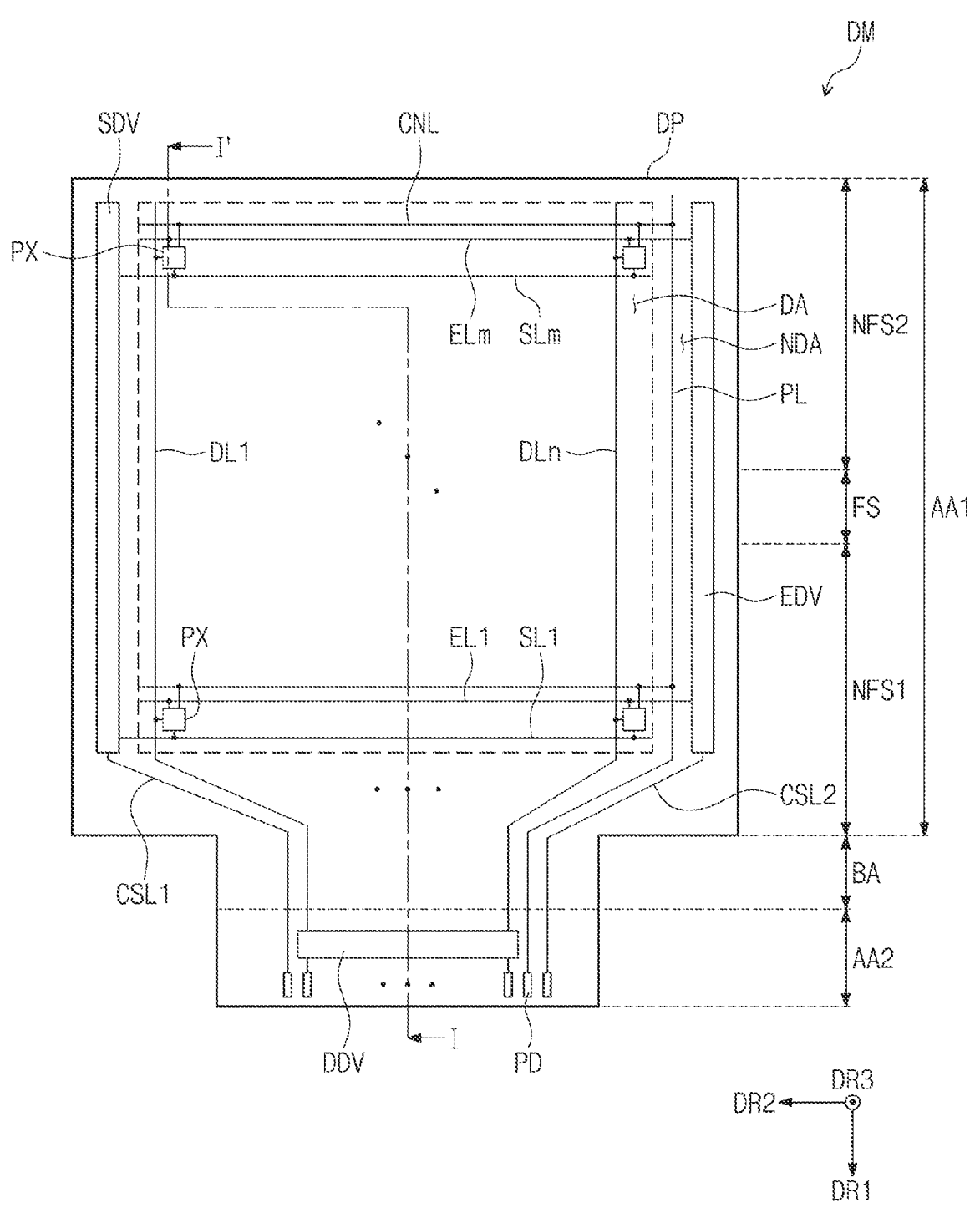
FIG. 7 is a plan view diagram of the display panel of FIG. 3.

FIG. 7 illustrates the display panel of FIG. 3 in greater detail.

Referring to FIG. 7, the display module DM may include a display panel DP, a scan driver SDV, a data driver DDV, and an emission driver EDV.

The display panel DP may include a first area AA1, a second area AA2, and a bending area BA disposed between the first area AA1 and the second area AA2. The bending area BA extends in the second direction DR2; and the first area AA1, the bending area BA, and the second area AA2 may be arranged in the first direction DR1.

The first area AA1 may include a display area DA and a non-display area NDA around the display area DA. The non-display area NDA may surround the display area DA. An image may be displayed on the display area DA but need not be displayed on the non-display area NDA. The second area AA2 and the bending area BA may be areas on which an image is not displayed.

When viewed in the second direction DR2, the first area AA1 may include a first non-folding segment NFS1, a second non-folding segment NFS2, and a folding segment FS disposed between the first non-folding segment NFS1 and the second non-folding segment NFS2.

The display panel DP may include a plurality of pixels PX, a plurality of scan lines SL1 to SLm, a plurality of data lines DL1 to DLn, a plurality of emission lines EL1 to ELm, first and second control lines CSL1 and CSL2, a power line PL, a plurality of connection lines CNL, and a plurality of pads PD. Here, m and n are non-zero natural numbers. The pixels PX may be disposed on the display area DA and connected to the scan lines SL1 to SLm, the data lines DL1 to DLn, and the emission lines EL1 to ELm.

A scan driver SDV and an emission driver EDV may be disposed on the non-display area NDA. The scan driver SDV and the emission driver EDV may be disposed on the non-display area NDA adjacent to both sides of the first area AA1, which sides are opposite to each other in the second direction DR2. The data driver DDV may be disposed on the second area AA2. The data driver DDV may be manufactured in the form of an integrated circuit chip and mounted on the second area AA2.

The scan lines SL1 to SLm may be arranged in the first direction and extend in the second direction DR2 and be connected to the scan driver SDV. The data lines DL1 to DLn may be arranged in the second direction and extend in the first direction DR1 and be connected to the data driver DDV via the bending area BA. The emission lines EL1 to ELm may be arranged in the first direction and extend in the second direction DR2 and be connected to a gate driver EDV.

The power line PL may extend in the first direction DR1 and be disposed in or on the non-display area NDA. The power line PL may be disposed between the display area DA and the emission driver EDV, but is not limited thereto. For example, the power line PL may be disposed between the display area DA and the scan driver SDV.

The power line PL may extend to the second area AA2 via the bending area BA. The power line PL may extend toward a lower end of the second area AA2 when viewed on a plane. The power line PL may receive a driving voltage.

The connection lines CNL may extend in the second direction DR2 and be arranged in the first direction DR1. The connection lines CNL may be connected to the power line PL and the pixels PX. The driving voltage may be applied to the pixels PX through the power line PL and the connection lines CNL, which are connected to each other.

The first control line CSL1 may be connected to the scan driver SDV and extend toward the lower end of the second area AA2 via the bending area BA. The second control line CSL2 may be connected to the emission driver EDV and extend toward the lower end of the second area AA2 via the bending area BA. The data driver DDV may be disposed in the second area AA2 between the first control line CSL1 and the second control line CSL2.

When viewed on the plane, the pads PD may be disposed adjacent to the lower end of the second area AA2. The data driver DDV, the power line PL, the first control line CSL1, and the second control line CSL2 may be connected to the pads PD via the bending area BA.

The data lines DL1 to DLn may be connected to corresponding pads PD through the data driver DDV. For example, the data lines DL1 to DLn may be connected to the data driver DDV, and the data drivers DDV may be connected to the pads PD, which respectively correspond to the data lines DL1 to DLn.

A printed circuit board may be connected to the pads PD, and a timing controller and a voltage generator may be disposed on the printed circuit board. The timing controller may be manufactured as an integrated circuit chip and mounted on the printed circuit board. The timing controller and the voltage generator may be connected to the pads PD through the printed circuit board.

The timing controller may control operations of the scan driver SDV, the data driver DDV, and the emission driver EDV. The timing controller may generate a scan control signal, a data control signal, and an emission control signal in response to control signals received from the outside. The voltage generator may generate or control the driving voltage.

The scan control signal may be provided to the scan driver SDV through the first control line CSL1. The emission control signal may be provided to the emission driver EDV through the second control line CSL2. A data control signal may be provided to the data driver DDV. The timing controller may receive image signals from the outside and convert a data format of the image signals to match an interface specification with the data driver DDV, and provide the converted data format to the data driver DDV.

The scan driver SDV may generate a plurality of scan signals in response to scan control signals. The scan signals may be applied to the pixels PX through the scan lines SL1 to SLm. The scan signals may be sequentially applied to the pixel PX.

The data driver DDV may generate a plurality of data voltages corresponding to image signals in response to data control signals. The data voltages may be provided to the pixels PX through the data lines DL1 to DLn. The emission driver EDV may generate a plurality of emission signals in response to emission signals. The emission signals may be applied to the pixels PX through the emission lines EL1 to ELm.

The pixels PX may receive the data voltages in response to the scan signals. The pixels PX may emit light having luminance corresponding the data voltages in response to the emission signals to display an image. An emission time of the pixels PX may be controlled by the emission signals.

Figure 8:
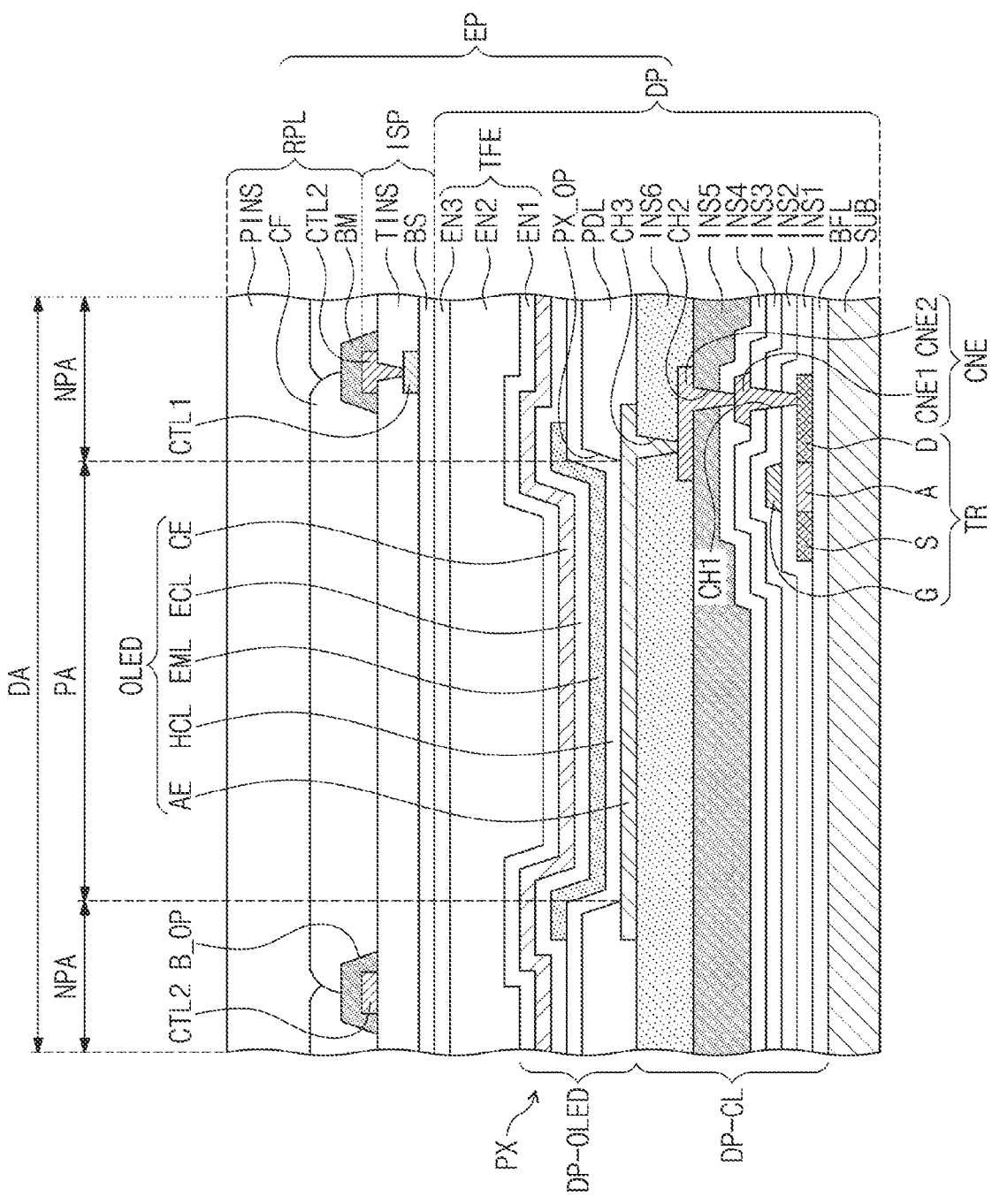
FIG. 8 is a cross-sectional view diagram illustrating an example of an electronic panel corresponding to one pixel of FIG. 7.

FIG. 8 illustrates a non-limiting example of a cross-section of the electronic panel corresponding to one pixel of FIG. 7.

Referring to FIG. 8, the pixel PX may include a transistor TR and a light-emitting element OLED. The light-emitting element OLED may include a first electrode or anode AE, a second electrode or cathode CE, a hole control layer HCL, an electron control layer ECL, and an emission layer EML.

The transistor TR and the light-emitting element OLED may be disposed on the substrate SUB. For example, one transistor TR is illustrated, but substantially, the pixel PX may include a plurality of transistors and at least one capacitor, which drive the light-emitting element OLED.

The display area DA may include an emission area PA corresponding to each of the pixels PX and a non-emission area NPA around the emission area PA. The light-emitting element OLED may be disposed on the emission area PA.

A buffer layer BFL may be disposed on the substrate SUB, and the buffer layer BFL may be an inorganic layer. A semiconductor pattern may be disposed on the buffer layer BFL. The semiconductor pattern may include polysilicon, amorphous silicon, and/or metal oxide.

The semiconductor pattern may be doped with an N-type dopant or a P-type dopant. The semiconductor pattern may include a highly doped region and a lowly doped region. The highly doped region may have conductivity greater than that of the lowly doped region to substantially serve as a source electrode and a drain electrode of the transistor TR. The lowly doped region may substantially correspond to an active region or channel of the transistor.

A source S, an active region or channel A, and a drain D of the transistor TR may be formed from the semiconductor pattern. A first insulating layer INS1 may be disposed on the semiconductor pattern. A gate G of the transistor TR may be disposed on the first insulating layer INS1. A second insulating layer INS2 may be disposed on the gate G. A third insulating layer INS3 may be disposed on the second insulating layer INS2.

The connection electrode CNE may include a first connection electrode CNE1 and a second connection electrode CNE2 to connect the transistor TR to the light-emitting element OLED. The first connection electrode CNE1 may be disposed on the third insulating layer INS3 and be connected to the drain D through a first contact hole CH1 defined in the first to third insulating layers INS1 to INS3.

A fourth insulating layer INS4 may be disposed on the first connection electrode CNE1. A fifth insulating layer INS5 may be disposed on the fourth insulating layer INS4. The second connection electrode CNE2 may be disposed on the fifth insulating layer INS5. The second connection electrode CNE2 may be connected to the first connection electrode CNE1 through the second contact hole CH2 as defined in the fourth and fifth insulating layers INS4 and INS5.

A sixth insulating layer INS6 may be disposed on the second connection electrode CNE2. A layer including the buffer layer BFL through to the sixth insulating layer INS6 may be defined as the circuit element layer DP-CL. Each of the first insulating layer INS1 to the sixth insulating layer INS6 may be one or the other of an inorganic layer or an organic layer.

The first electrode AE may be disposed on the sixth insulating layer INS6. The first electrode AE may be connected to the second connection electrode CNE2 through a third contact hole CH3 defined in the sixth insulating layer INS6. A pixel defining layer PDL may be disposed on the first electrode AE and the sixth insulating layer INS6. An opening for exposing a predetermined portion of the first electrode AE is defined in the pixel defining layer PDL.

The hole control layer HCL may be disposed on the first electrode AE and the pixel defining layer PDL. The hole control layer HCL may include a hole transport layer and a hole injection layer.

The emission layer EML may be disposed on the hole control layer HCL. The emission layer EML may be disposed on an area corresponding to the opening PX_OP. The emission layer EML may include an organic material and/or an inorganic material. The emission layer EML may emit one of red light, green light, and/or blue light, without limitation thereto.

The electronic control layer ECL may be disposed on the hole control layer HCL to cover the emission layer EML. The charge control layer OL may include an electron transport layer and an electron injection layer. A hole control layer HCL and an electron control layer ECL may be commonly disposed on the emission area PA and the non-emission area NPA.

The second electrode CE may be disposed on the electronic control layer ECL. The second electrode CE may be commonly disposed in the pixels PX. The layer on which the light-emitting element OLED is disposed may be defined as the display element layer DP-OLED.

The thin film encapsulation layer TFE may be disposed on the second electrode CE to cover the pixel PX. The thin film encapsulation layer TFE may include a first encapsulation layer EN1 disposed on the second electrode CE, a second encapsulation layer EN2 disposed on the first encapsulation layer EN1, and a third encapsulation layer EN3 disposed on the second encapsulation layer EN2.

Each of the first and third encapsulation layers EN1 and EN3 may include an inorganic insulating layer and may protect the pixel PX against moisture and/or oxygen. The second encapsulation layer EN2 may include an organic insulating layer and may protect the pixel PX against foreign substances such as dust particles.

A first voltage may be applied to the first electrode AE through the transistor TR, and a second voltage having a level lower than that of the first voltage may be applied to the second electrode CE. Holes and electrons injected into the light-emitting layer EML may be coupled to each other to form exciton. While the exciton may be transitioned to a ground state, the light-emitting element OLED may emit light.

The input sensing part ISP may be disposed on the thin film encapsulation layer TFE. The input sensing part ISP may be manufactured directly on a top surface of the thin film encapsulation layer TFE.

A base layer BS may be disposed on the thin film encapsulation layer TFE. The base layer BS may include an inorganic insulating layer. At least one inorganic insulating layer may be provided on the thin film encapsulation layer TFE as the base layer BS.

The input sensing part ISP may include a first conductive pattern CTL1 and a second conductive pattern CTL2 disposed on the first conductive pattern CTL1. The first conductive pattern CTL1 may be disposed on the base layer BS. An insulating layer TINS may be disposed on the base layer BS to cover the first conductive pattern CTL1. The insulating layer TINS may include an inorganic insulating layer or an organic insulating layer. The second conductive pattern CTL2 may be disposed on the insulating layer TINS.

The first and second conductive patterns CTL1 and CTL2 may overlap the non-emission areas NPA. The first and second conductive patterns CTL1 and CTL2 may be disposed on the non-emission areas NPA and may have a mesh shape.

The first and second conductive patterns CTL1 and CTL2 may form sensors of the input sensing part ISP. For example, the mesh-shaped first and second conductive patterns CTL1 and CTL2 may be separated from each other in a predetermined region to form the sensors. A portion of the second conductive pattern CTL2 may be connected to the first conductive pattern CTL1.

An anti-reflection layer RPL may be disposed on the second conductive pattern CTL2. The anti-reflection layer RPL may include a black matrix BM and a plurality of color filters CF. The black matrix BM may overlap the non-emission area NPA, and the color filters CF may overlap the emission area PA, respectively.

The black matrix BM may be disposed on the insulating layer TINS to cover the second conductive pattern CTL2. An opening B_OP overlapping the emission area PA and the opening PX_OP may be defined in the black matrix BM. The black matrix BM may absorb and block light. A width of the opening B_OP may be greater than a width of the opening PX_OP.

The color filters CF may be disposed on the first insulating layer TINS and the black matrix BM. The color filters CF may be respectively disposed in the openings B_OP. A planarization insulating layer PINS may be disposed on the color filters CF. The planarization insulating layer PINS may provide a flat top surface.

When the external light traveling toward the display panel DP is reflected from the display panel DP and provided again to an external user, the user may visually recognize the external light, like a mirror. To prevent this phenomenon, for example, the anti-reflection layer RPL may include a plurality of color filters CF displaying substantially the same color as the pixels PX of the display panel DP. The color filters CF may filter external light with substantially the same colors as the pixels PX. In this case, the external light need not be visually recognized by the user.

However, embodiments of the inventive concept are not limited thereto, and the anti-reflection layer RPL may include a polarizing film to reduce the reflectance of the external light. The polarizing film may be separately manufactured and attached on the input sensing part IS by an adhesive layer. The polarizing film may include a retarder and/or a polarizer.

Figure 9A:
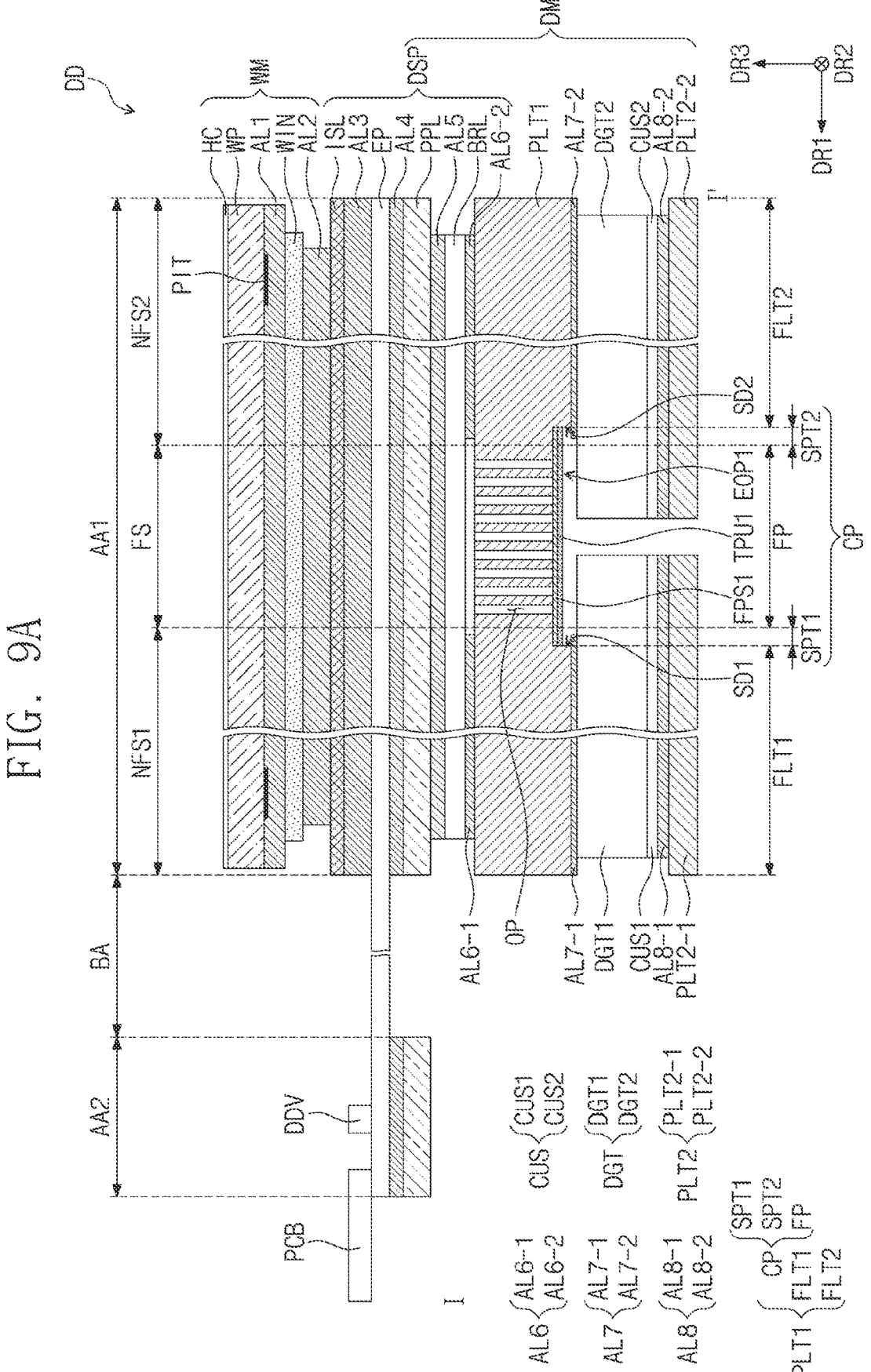
FIG. 9A is a cross-sectional view diagram taken along line I-I' of FIG. 7.
Figure 9B:
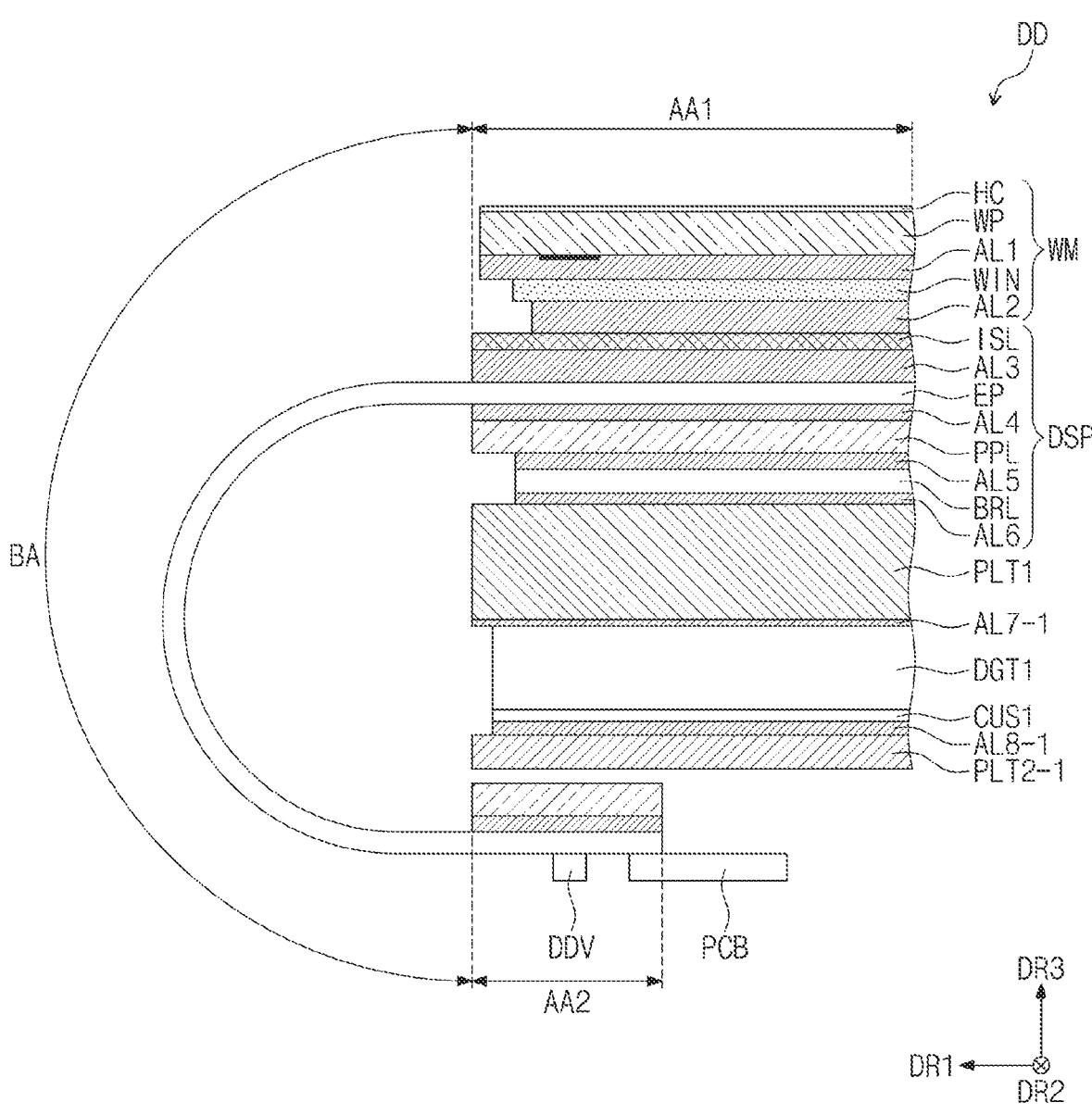
FIG. 9B is a cross-sectional view diagram illustrating a state in which a bending area of FIG. 9A is bent.
Figure 10A:
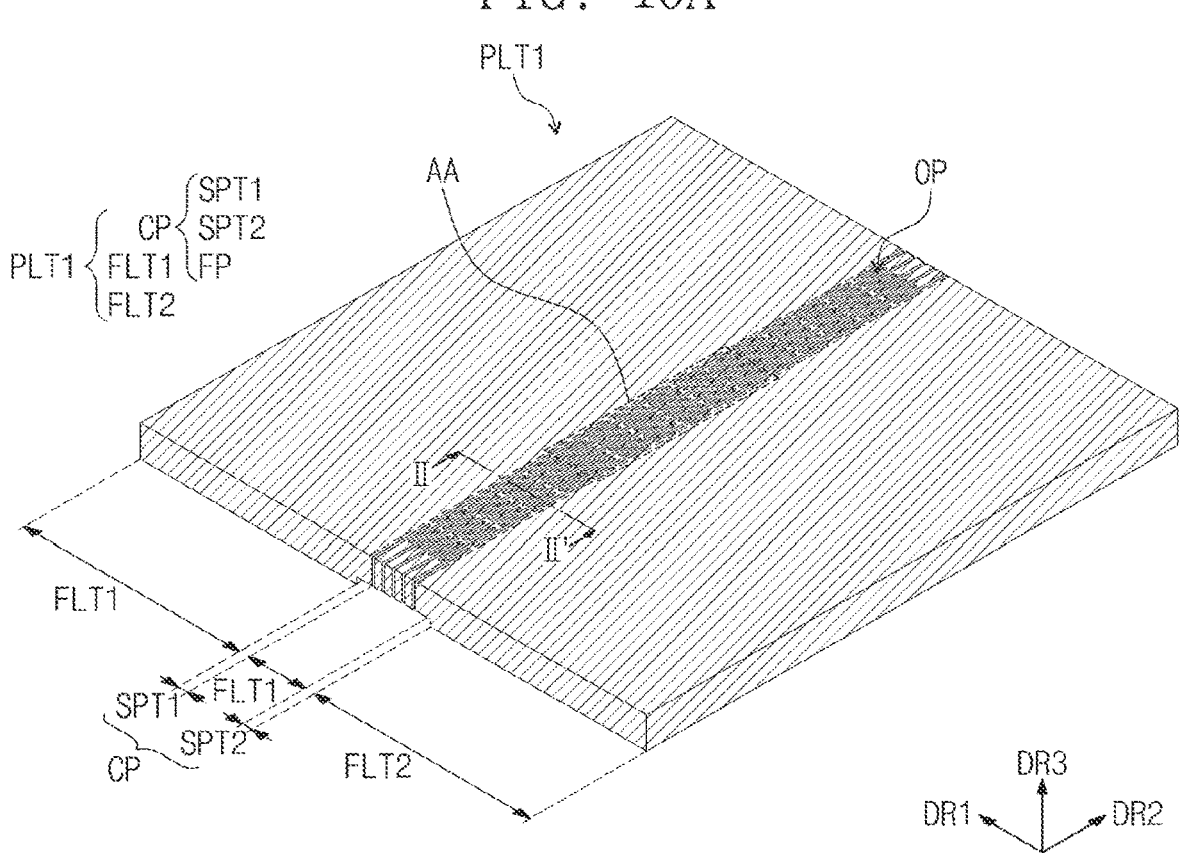
FIGS. 10A to 10C are diagrams for explaining a support plate of FIG. 9A.
Figure 10B:
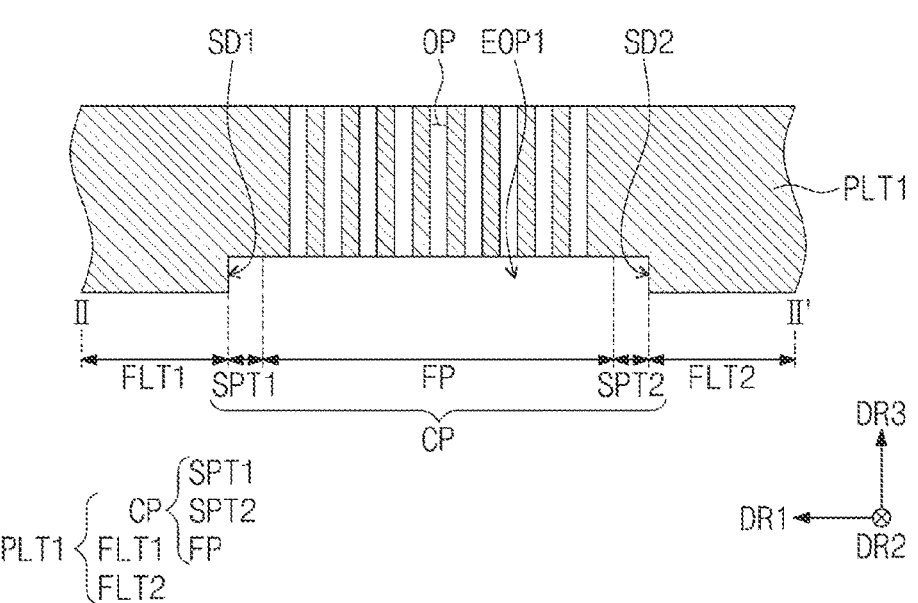
Figure 10C:
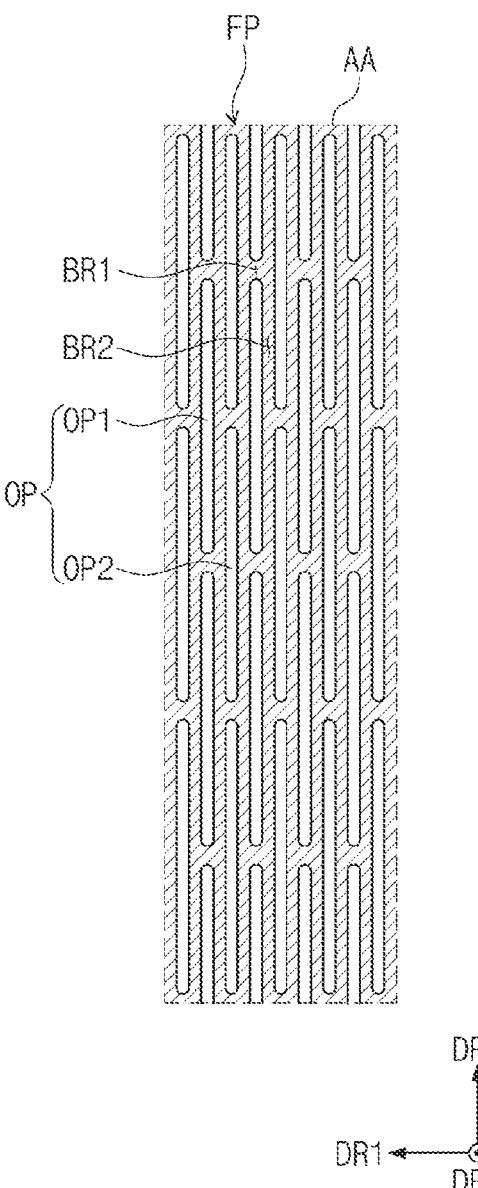
Figure 11:
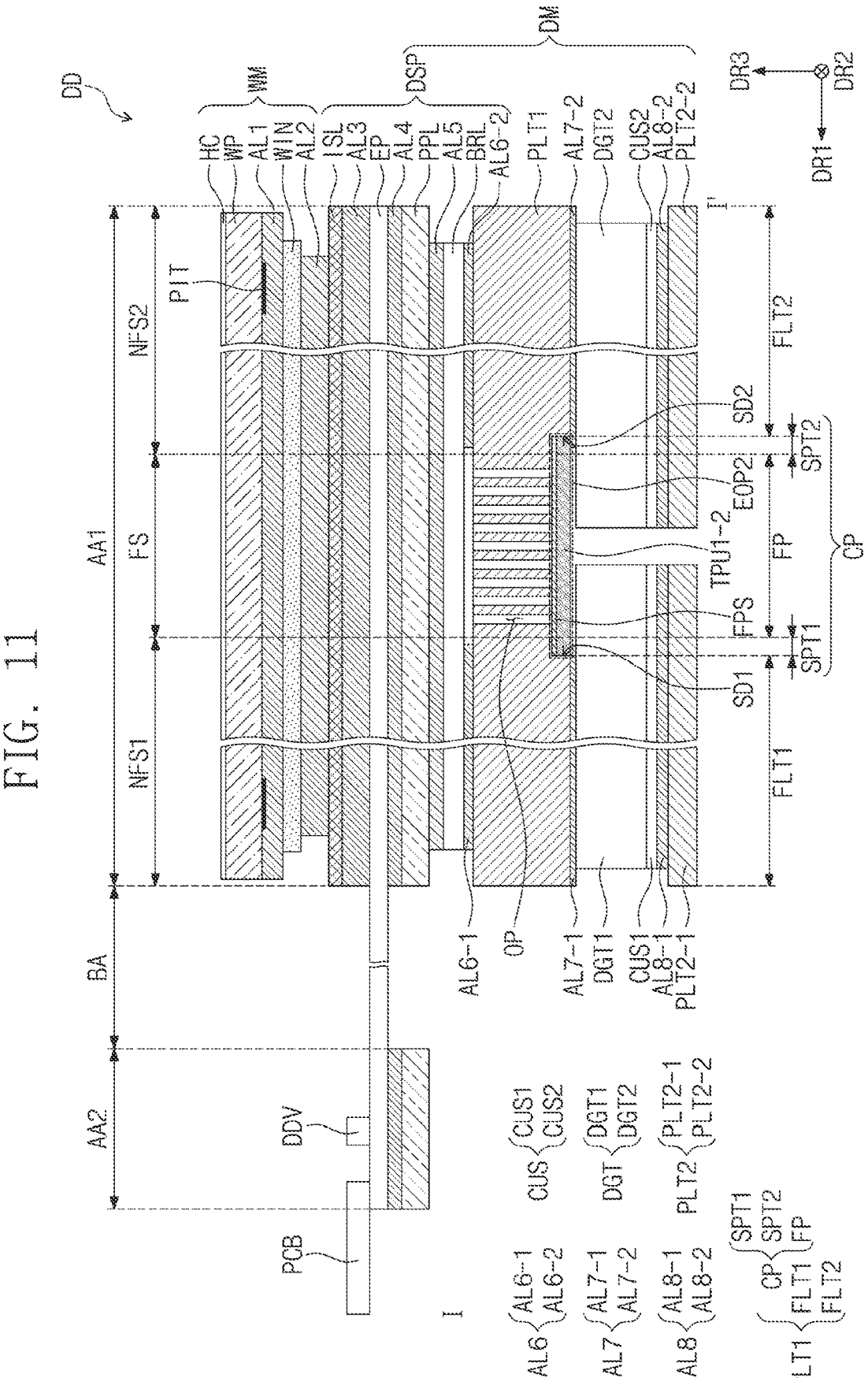
FIG. 11 is a cross-sectional view diagram taken along line I-I' of FIG. 7 according to an embodiment of the inventive concept.

FIG. 9A illustrates a cross-sectional view taken along line I-I' of FIG. 7. FIG. 9B is a view illustrating a state in which a bending area of FIG. 9A is bent. FIGS. 10A to 10C illustrate views for explaining a support plate of FIG. 9A. FIG. 11 illustrates a cross-sectional view taken along line I-I' of FIG. 7 according to an embodiment of the inventive concept.

FIG. 9B illustrates a portion of a display part DSP, a portion of a window module WM, a portion of a first support plate PLT1, a first primary adhesive layer AL1-1, and a second primary support plate PLT2-1.

FIG. 10B illustrates a cross-sectional view taken along line II-II' of FIG. 10A.

FIG. 10C illustrates an enlarged plan view of an area AA of FIG. 10A.

Since components illustrated in FIG. 11 may be substantially the same as those illustrated in FIG. 10 except for a first secondary cover layer TPU1-2, descriptions of FIG. 11 may be focused on differences from those of FIG. 10, and substantially duplicate description thereof may be simplified or omitted. Referring to FIG. 9A, the display device DD may include the display module DM and the window module WM disposed on the display module DM. The display module DM may be a flexible display module. The display module DM may include a first non-folding segment NFS1, a folding segment FS, and a second non-folding segment NFS2.

The window module WM may include a window WIN, a window protective layer WP, a hard coating layer HC, and first and second adhesive layers AL1 and AL2.

The display module DM may include a display part DSP, a first support plate PLT1, a first folding adhesive layer FPS1, a first cover layer TPU1, a seventh adhesive layer AL7, a digitizer DGT, a cushion layer CUS, an eighth adhesive layer AL8, and a second support plate PLT2.

In an embodiment, at least some of the folding segment of the plate may be etched to create a space for a cover layer or TPU to settle. By attaching the cover layer or TPU to the etched space, the thickness of the folding part may be minimized and the thickness of the cover layer or TPU may be maximized. Moreover, deformation of the cover layer or TPU may be reduced, thereby improving entrapment of the cover layer or TPU into a lattice.

Since configurations of the electronic panel EP and the panel protective layer PPL have been described in detail with reference to FIG. 5, substantially duplicate description of the electronic panel EP and the panel protective layer PPL may be simplified or omitted.

The impact absorption layer ISL may be disposed on the electronic panel EP. The impact absorption layer ISL may protect the electronic panel EP by absorbing an external impact applied from the upper side of the display device DD toward the electronic panel EP. The impact absorption layer ISL may be manufactured in the form of a stretched film.

The impact absorption layer ISL may include a flexible plastic material. The flexible plastic material may be defined as a synthetic resin film. For example, the impact absorption layer ISL may include a flexible plastic material such as polyimide (PI) or polyethylene terephthalate (PET).

The window WIN may be disposed on the impact absorption layer ISL. The window WIN may protect the electronic panel EP from external scratches. The window WIN may have optically transparent properties. The window WIN may include glass. However, embodiments of the inventive concept are not limited thereto, and the window WIN may include a synthetic resin film.

The window WIN may have a single-layer or multi-layer structure. For example, the window WIN may include a plurality of plastic films bonded to each other by using an adhesive or include a glass substrate and a plastic film, which are bonded to each other by using an adhesive.

The window protective layer WP may be disposed on the window WIN. The window protective layer WP may include a flexible plastic material such as polyimide or polyethylene terephthalate. The hard coating layer HC may be disposed on a top surface of the window protective layer WP.

A printing layer PIT may be disposed on a bottom surface of the window protective layer WP. The printing layer PIT may have a black color, but the color of the printing layer PIT is not limited thereto. The printing layer PIT may be adjacent to an edge of the window protective layer WP.

The barrier layer BRL may be disposed below the panel protective layer PPL. Resistance to compression force, such as due to external pressing, may be increased by the barrier layer BRL. Thus, the barrier layer BRL may serve to prevent deformation of the electronic panel EP from occurring. The barrier layer BRL may include a flexible plastic material such as polyimide or polyethylene terephthalate.

The barrier layer BRL may have a color that absorbs light. For example, the barrier layer BRL may have a black color. In this case, when viewing the display module DM from an upper side of the display module DM, components disposed below the barrier layer BRL need not be visually recognized.

The first adhesive layer AL1 may be disposed between the window protective layer WP and the window WIN. The window protective layer WP and the window WIN may be bonded to each other by the first adhesive layer AL1. The first adhesive layer AL1 may cover the printing layer PIT.

The second adhesive layer AL2 may be disposed between the window WIN and the impact absorption layer ISL. The window WIN and the impact absorption layer ISL may be bonded to each other by the second adhesive layer AL2.

The third adhesive layer AL3 may be disposed between the impact absorption layer ISL and the electronic panel EP. The impact absorption layer ISL and the electronic panel EP may be bonded to each other by the third adhesive layer AL3.

The fourth adhesive layer AL4 may be disposed between the electronic panel EP and the panel protective layer PPL. The electronic panel EP and the panel protective layer PPL may be bonded to each other by the fourth adhesive layer AL4.

The fifth adhesive layer AL5 may be disposed between the panel protective layer PPL and the barrier layer BRL. The panel protective layer PPL and the barrier layer BRL may be bonded to each other by the fifth adhesive layer AL5.

The sixth adhesive layer AL6 may be disposed between the barrier layer BRL and the support plate PLT. The barrier layer BRL and the first support plate PLT may be bonded to each other by the sixth adhesive layer AL6.

The sixth adhesive layer AL6 may overlap the first and second non-folding segments NFS1 and NFS2 and need not overlap the folding segment FS. That is, the sixth adhesive layer AL6 need not be disposed on the folding segment FS.

Each of the first to sixth adhesive layers AL1 to AL6 may include a transparent adhesive such as a pressure sensitive adhesive (PSA) and/or an optically clear adhesive (OCA), but the type of adhesive is not limited thereto.

In an embodiment, a cover layer or TPU is inserted or settled into the plate. Thus, the thickness of the PSA may be unrestricted, PSA thinning may be realized, and the difference between the plate and the digitizer may be minimized to optimize latticing.

Hereinafter, in this specification, a "thickness" may indicate a value measured in the third direction DR3, and a "width" may indicate a value measured in the first direction DR1 or the second direction DR2, which is a horizontal direction.

A thickness of the panel protective layer PPL may be less than that of the window protective layer WP, and a thickness of the barrier layer BRL may be less than that of the panel protective layer PPL. A thickness of the electronic panel EP may be less than that of the barrier layer BRL and may be substantially the same as that of the window WIN. A thickness of the impact absorption layer ISL may be less than that of the electronic panel EP.

A thickness of the first adhesive layer AL1 may be substantially the same as that of the barrier layer BRL, and a thickness of either or both of the second adhesive layer AL2 and the third adhesive layer AL3 may be substantially the same as that of the panel protective layer PPL. A thickness of the fourth adhesive layer AL4 may be substantially the same as that of the fifth adhesive layer AL5.

Each of the fourth and fifth adhesive layers AL4 and AL5 may have a thickness less than that of the electronic panel EP and greater than that of the impact absorption layer ISL. A thickness of the sixth adhesive layer AL6 may be less than that of the impact absorption layer ISL. A thickness of the hard coating layer HC may be less than that of the sixth adhesive layer AL6.

The electronic panel EP, the impact absorption layer ISL, the panel protective layer PPL, and the third and fourth adhesive layers AL3 and AL4 may have substantially the same width. A width of the electronic panel EP may be defined as a width of a portion of the electronic panel EP disposed on the first area AA1. The window protective layer WP and the first adhesive layer AL1 may have substantially the same width. The barrier layer BRL and the fifth and sixth adhesive layers AL5 and AL6 may have substantially the same width.

The widths of the electronic panel EP, the impact absorption layer ISL, the panel protective layer PPL, and the third and fourth adhesive layers AL3 and AL4 may be disposed outside edges of the window protective layer WP and/or the first adhesive layer AL1.

A width of either or both of the window WIN and the second adhesive layer AL2 may be less than that of either or both of the window protective layer WP and the first adhesive layer AL1. The width of the second adhesive layer AL2 may be less than that of the window WIN. The edge of the window WIN may be disposed inside the edge of either or both of the window protective layer WP and the first adhesive layer AL1. The edge of the second adhesive layer AL2 may be disposed inside the edge of the window WIN.

A width of either or both of the barrier layer BRL and the fifth and sixth adhesive layers AL5 and AL6 may be less than that of either or both of the window protective layer WP and the first adhesive layer AL1. Edges of the barrier layer BRL and the fifth and sixth adhesive layers AL5 and AL6 may be disposed inside the edges of the window protective layer WP and the first adhesive layer AL1.

Referring to FIGS. 9A and 10A to 10C, the first support plate PLT1 may be disposed under the display part DSP to support the display part DSP. The first support plate PLT1 may support the electronic panel EP.

The first support plate PLT1 may have a rigidity greater than that of the display part DSP. The first support plate PLT1 may include a non-metal material. The first support plate PLT1 may include a reinforcing fiber composite. For example, the reinforcing fiber composite may be carbon fiber reinforced plastic (CFRP) and/or glass fiber reinforced plastic (GFRP).

The first support plate PLT1 may include a reinforcing fiber composite, and may be lightweight. The first support plate PLT1 according to an embodiment may include a reinforcing fiber composite material and thus have a lighter weight compared to the metal support plate using a metal material, and have an elasticity modulus and strength similar to that of the metal support plate. For example, the elasticity modulus of the first support plate PLT1 may be 20 GPa to 190 GPa.

In addition, since the first support plate PLT1 may include the reinforcing fiber composite, the shape processing of the first support plate PLT1 may be optimized compared to the metal support plate. For example, the first support plate PLT1 including the reinforcing fiber composite may be more readily processed through a laser process or a micro-blast process. However, embodiments of the inventive concept are not limited thereto, and the first support plate PLT1 may be a metal support plate.

The first support plate PLT1 may include a first flat part FLT1, a second flat part FLT2, and a central part CP. The central part CP may be disposed between the first and second flat parts FLT1 and FLT2. The first flat part FLT1, the central part CP, and the second flat part FLT2 may be arranged in the first direction DR1. Moreover, the first and second flat parts FLT1 and FTL2 and the central part CP may be substantially integrated with each other.

The first flat part FLT1 and the second flat part FLT2 may overlap the first non-folding segment NFS1 and the second non-folding segment NFS2, respectively. A portion of the central part CP may overlap the folding segment FS. Edges of the central part CP may overlap the first non-folding segment NFS1 and the second non-folding segment NFS2, respectively.

A height of a bottom surface of the central part CP may be greater than that of either or both of bottom surfaces of the first and second flat parts FLT1 and FLT2. A height of a top surface of the central part CP may be disposed on substantially the same plane as a height of either or both of top surfaces of the first and second flat parts FLT1 and FLT2.

A thickness of the central part CP may be less than that of either or both of the first and second flat parts FLT1 and FLT2. For example, when the first support plate PLT1 is a metal support plate, the thickness of the central part CP may be about 150 micrometers, and the thicknesses of either or both of the first and second flat parts FLT1 and FLT2 may be about 166 micrometers to about 178 micrometers.

For example, when the first support plate PLT1 includes a reinforcing fiber composite material, the central part CP may have a thickness of about 170 micrometers, and each of the first and second flat parts FLT1 and FLT2 may have a thickness of about 186 micrometers to about 198 micrometers.

A first surface SD1 and a second surface SD2 may be defined as first and second flat parts FLT1 and FLT2 that are exposed to the outside due to a difference in thickness between the first and second flat parts FLT1 and FLT2, at both sides of the first and second flat parts FLT1 and FLT2, which are opposite to each other in the first direction DRF1. The first surface FS1 and the second surface SF2 may face each other.

A first folding groove EOP1 overlapping the central part CP may be defined in the bottom surface of the first support plate FLT1 due to the difference in thicknesses between the first and second flat parts FLT1 and FLT2 and the central part CP. The first folding groove EOP1 may be defined by the bottom surface of the central part CP and the first and second surfaces SD1 and SD2.

When viewed in the second direction DR2, the first folding groove EOP1 may have a partial quadrangular shape. A depth of the first folding groove EOP1 may be about 16 micrometers to about 28 micrometers. The depth of the first folding groove EOP1 may be substantially the same as a length of either or both of the first and second surfaces SD1 and SD2 in the third direction DR3. The depth of the first folding groove EOP1 may be defined as a difference between the height of the bottom surface of the central part CP and the height of either or both of the bottom surfaces of the first and second flat parts FLT1 and FLT2.

The central part CP may include a folding part FP, a first sub-flat part SPT1, and a second sub-flat part SPT2. The first sub-flat part SPT1 may be disposed between the first flat part FLT1 and the folding part FP. The second sub-flat part SPT2 may be disposed between the folding part FP and the second flat part FLT2. The first sub-flat part SPT1, the folding part FP, and the second sub-flat part SPT2 may be arranged in the first direction DR1.

The folding part FP may overlap the folding segment FS. The first sub-flat part SPT1 may overlap the first non-folding segment NFS1. The second sub-flat part SPT2 may overlap the second non-folding segment NFS2.

A bottom surface of the folding part FP and the bottom surfaces of the first and second sub-flat parts SPT1 and SPT2 may be defined in substantially the same plane. Moreover, the bottom surface of the folding part FP and the bottom surface of the first and second sub-flat parts SPT1 and SPT2 may be substantially integrally provided.

The bottom surface of the folding part FP may be disposed higher than each of the bottom surfaces of the first and second flat parts FLT1 and FLT2. Each of the bottom surfaces of the first and second sub-flat parts SPT1 and SPT2 may be disposed higher than each of the bottom surfaces of the first and second flat parts FLT1 and FLT2.

The top surface of the folding part FP and the top surfaces of the first and second sub-flat parts SPT1 and SPT2 may define substantially the same plane as the top surfaces of the first and second flat parts FLT1 and FLT2. Moreover, the top surface of the folding part FP, the top surfaces of the first and second sub-flat parts SPT1 and SPT2, and the top surfaces of the first and second flat parts FLT1 and FLT2 may be substantially integrally provided.

The folding part FP and the first and second flat parts FLT1 and FLT2 may have different thicknesses. For example, the thickness of the folding part FP may be less than that of either or both of the first and second flat parts FLT1 and FLT2.

The thickness of the first and second sub-flat parts SPT1 and SPT2 may be substantially the same as that of the folding part FP. Each of thicknesses of the first and second sub-flat parts SPT1 and SPT2 may be less than that of either or both of the first and second flat parts FLT1 and FLT2.

According to this structure, the first folding groove EOP1 may be defined in the bottom surface of the first support plate PLT1 overlapping the folding part FP and the first and second sub-flat parts SPT1 and SPT2.

A plurality of openings OP may be defined in a portion of the first support plate PLT1 overlapping the folding segment FS. The openings OP may pass through portions of the first support plate PLT1 in the third direction DR3. The openings OP may be formed through the above-described laser process or micro-blast process.

The openings OP may be arranged in a predetermined rule. The openings OP may be arranged in a grid shape to provide a grid pattern on the folding part FP.

Since the openings OP are defined in the folding part FP, a surface area of the folding part FP may be reduced to reduce rigidity of the folding part FP. Thus, when the openings OP are defined in the folding part FP, flexibility of the folding part FP may be further improved compared to a case in which the openings OP are not defined. As a result, the folding part FP may be more readily folded.

The openings OP may include a plurality of first openings OP1 arranged in the second direction DR2 and a plurality of second openings OP2 arranged in the second direction DR2 so as to be adjacent to the first openings OP1 in the first direction DR1. The first openings OP1 and the second openings OP2 may be disposed to cross each other.

The folding part FP may include first branch parts BR1 and second branch parts BR2. The first branch parts BR1 may be disposed between the first openings OP1 adjacent to each other in the second direction DR2 or between second openings OP2 adjacent to each other in the second direction DR2. The second branch parts BR2 may be disposed between the first openings OP1 and the second openings OP2, which are adjacent to each other in the first direction DR1.

Referring to FIGS. 9A and 11, the first folding adhesive layer FPS1 may be disposed in the first folding groove EOP1. The first folding adhesive layer FPS1 may be disposed under the bottom surface of the central part CP. The first folding adhesive layer FPS1 may be disposed below the folding part FP and the bottom surfaces of the first and second sub-flat parts SPT1 and SPT2. The first folding adhesive layer FPS1 may overlap the openings OP. For example, a thickness of the first folding adhesive layer FPS1 may be about 8 micrometers.

The first cover layer TPU1 may be disposed in the first folding groove EOP1. The first cover layer TPU1 may be disposed below the bottom surface of the central part CP. The first cover layer TPU1 may be disposed below each of the folding part FP and the bottom surfaces of the first and second sub-flat parts SPT1 and SPT2. The first cover layer TPU1 may be attached to the bottom surface of the first folding adhesive layer FPS1.

The first folding adhesive layer FPS1 may be disposed between the first cover layer TPU1 and the bottom surfaces of the folding part FP and between the first cover layer TPU1 and the bottom surfaces of the first and second sub-flat parts SPT1 and SPT2.

The first cover layer TPU1 may overlap the folding segment FS. The first cover layer TPU1 may overlap the folding part FP and the first and second sub-flat parts SPT1 and SPT2.

A thickness of the first cover layer TPU1 may be about 8 micrometers to about 20 micrometers. The sum of the thickness of the first cover layer TPU1 and the thickness of the first folding adhesive layer FPS1 may be about 16 micrometers to about 28 micrometers. A depth of the first folding groove EOP1 may be about 16 micrometers to about 28 micrometers. Thus, when the first folding adhesive layer FPS1 and the first cover layer TPU1 are disposed in the first folding groove EOP1, the bottom surface of the first cover layer TPU1 need not protrude downward farther than each of the first and second flat parts FLT1 and FLT2.

For example, as illustrated in FIG. 9A, the sum of the thicknesses of the first cover layer TPU1 and the first folding adhesive layer FPS1 may be less than a depth of the first folding groove EOP1. Thus, the bottom surface of the first cover layer TPU1 may be disposed higher than each of the bottom surfaces of the first and second flat parts FLT1 and FLT2.

For example, as illustrated in FIG. 11, the sum of the thicknesses of the first and second cover layers TPU1-2 and the first folding adhesive layer FPS1 may be equal to the depth of the first folding groove EOP1. Thus, each of bottom surfaces of the first and second cover layers TPU1-2 may be disposed at substantially the same height as each of bottom surfaces of the first and second flat parts FLT1 and FLT2.

The first cover layer TPU1 may cover the openings OP defined in the first support plate PLT1 under the first support plate PLT1. The first cover layer TPU1 may block moisture and foreign substances from being introduced into the openings OP defined in the first support plate PLT1.

When viewed on the plan view, the first cover layer TPU1 may overlap edges of the folding segment FS and the first and second non-folding segments NFS1 and NFS2 adjacent to the folding segment FS.

The first cover layer TPU1 may have an elastic modulus less than that of the first support plate PLT1. For example, the first cover layer TPU1 may include thermoplastic polyurethane or rubber, but the material of the first cover layer TPU1 is not limited thereto. The first cover layer TPU1 may be manufactured in the form of a sheet and attached to the first support plate PLT1.

The seventh adhesive layer AL7 may be disposed below the first support plate PLT1. The seventh adhesive layer AL7 may be defined as a lower adhesive layer AL7.

The seventh adhesive layer AL7 may be disposed between the first support plate PLT1 and the digitizer DGT to be described later. A top surface of the seventh adhesive layer AL7 may be directly disposed on a bottom surface of the first support plate PLT1. A bottom surface of the seventh adhesive layer AL7 may be directly disposed on a top surface of a digitizer DGT to be described later. The first support plate PLT1 and the digitizer DGT may be bonded to each other by the seventh adhesive layer AL7.

The seventh adhesive layer AL7 may overlap the first and second non-folding segments NFS1 and NFS2. The seventh adhesive layer AL7 need not overlap the folding segment FS. The seventh adhesive layer AL7 may overlap the first and second flat parts FLT1 and FLT2. The seventh adhesive layer AL7 may overlap the first and second sub-flat parts SPT1 and SPT2. The seventh adhesive layer AL7 need not overlap the folding part FP.

The seventh adhesive layer AL7 may include a seventh primary adhesive layer AL7-1 and a seventh secondary adhesive layer AL7-2. The seventh primary adhesive layer AL7-1 may be disposed under the first flat part FLT1 and the first sub-flat part SPT1. The seventh secondary adhesive layer AL7-2 may be disposed below the second flat part FLT1 and the second sub-flat part SPT2. The seventh primary adhesive layer AL7-1 and the seventh secondary adhesive layer AL7-2 need not be disposed below the folding part FP. The seventh primary adhesive layer AL7-1 and the seventh secondary adhesive layer AL7-2 may be spaced apart from each other in the first direction DR1.

One side of opposite sides of either or both of the seventh-first adhesive layer AL7-1 and the seventh secondary adhesive layer AL7-2 in the first direction DR1 may overlap an edge of the first cover layer TPU1. One side of the seventh primary adhesive layer AL7-1 and one side of the seventh secondary adhesive layer AL7-2 may be defined as facing each other.

For example, as illustrated in FIG. 9A, when the sum of the thicknesses of the first cover layer TPU1 and the first folding adhesive layer FPS1 is less than the depth of the first folding groove EOP1, the bottom surface of the first cover layer TPU1 may be disposed higher than each of the top surfaces of the seventh primary and seventh secondary adhesive layers AL7-1 and AL7-2.

For example, when the sum of the thicknesses of the first cover layer TPU1 and the first folding adhesive layer FPS1 is equal to the depth of the first folding groove EOP1, the bottom surface of the first cover layer TPU1 may be in contact with the top surfaces of the seventh primary and seventh secondary adhesive layers AL7-1 and AL7-2.

The digitizer DGT may be disposed under the first support plate PLT1. The digitizer DGT and the central part CP may be spaced apart from each other in the third direction DR3. The bottom surface of the first cover layer TPU1 may be spaced apart from the top surface of the digitizer DGT.

The digitizer DGT may be a device that receives location information instructed by the user on the display surface. The digitizer DGT may be implemented in an electromagnetic manner or electromagnetic resonance manner. For example, the digitizer DGT may include a digitizer sensor substrate including a plurality of coils. However, embodiments of the inventive concept are not limited thereto, and the digitizer DGT may be implemented as an active electrostatic type.

When the user moves a pen on the display device DD, the pen may be driven by an AC signal to generate vibrating magnetic fields, and the vibrating magnetic fields may induce a signal in the coil. The position of the pen may be detected through the signal induced in the coil. The digitizer DGT may sense the position of the pen by detecting an electromagnetic change generated by the approach of the pen.

If the first support plate PLT1 disposed on the digitizer DGT and adjacent to the digitizer DGT includes a metal, sensitivity of the digitizer DGT may be lowered by the metal. For example, when a signal transmitted on the display device DD is blocked due to a signal interference by the metal support plate, the digitizer DGT need not operate normally. However, in an embodiment of the inventive concept, since the first support plate PLT1 disposed on the digitizer DGT includes a non-metal reinforcing fiber composite, the digitizer DGT may operate normally.

The digitizer DGT may be divided into two portions on the folding segment FS. The digitizer DGT may include a first digitizer DGT1 disposed under the first non-folding segment NFS1 and a second digitizer DGT2 disposed under the second non-folding segment NFS2.

When viewed in on the plan view, the first digitizer DGT1 may overlap the first non-folding segment NFS1. When viewed in the plan view, the second digitizer DGT2 may overlap the second non-folding segment NFS2. The first digitizer DGT1 and the second digitizer DGT2 may extend to the folding segment FS and may be disposed adjacent to each other on the folding segment FS The digitizer DGT may further include a connection part. The connection part may overlap the folding segment FS. The connection part may be a flexible circuit board. The flexible circuit board may be provided in plurality. The first and second digitizers DGT1 and DGT2 may be connected to each other by flexible circuit boards.

When the first folding groove EOP1 is not defined in the first support plate PTL1, the first folding adhesive layer FPS1 and the first cover layer TPU1 may be disposed between the seventh primary and seventh-second adhesive layers AL7-1 and AL7-2, which are spaced apart from each other in the first direction. The first folding adhesive layer FPS1 and the first cover layer TPU1 may be disposed below the bottom surface of the first support plate PLT1. The bottom surface of the first cover layer TPU1 may be disposed higher than each of the top surfaces of the seventh primary and seventh secondary adhesive layers AL7-1 and AL7-2. Here, the sum of the thicknesses of the first folding adhesive layer FPS1 and the first cover layer TPU1 may be less than each of the thicknesses of the seventh primary and seventh secondary adhesive layers AL7-1 and AL7-2. The bottom surface of the first cover layer TPU1 need not be in contact with the top surface of the digitizer DGT by the seventh primary and seventh secondary adhesive layers AL7-1 and AL7-2. Thus, the electronic apparatus ED of FIG. 1 may be folded.

As the electronic apparatus ED of FIG. 1 is repeatedly folded, foreign substances may be separated from the first adhesive layer FPS1 and the first cover layer TPU1. The foreign substances may be introduced into the openings OP of the first support plate PLT1. Thus, the folding of the electronic apparatus ED such as shown in FIG. 1 might not be unimpeded.

To prevent the foreign substances from being introduced into the openings OP, each of the first adhesive layer FPS1 and the first cover layer TPU1 may increase in thickness. The thickness of either or both of the seventh primary and seventh secondary adhesive layers AL7-1 and AL7-2 may increase so that the bottom surface of the first cover layer TPU1 and the top surface of the digitizer DGT are not in contact with each other. As the thickness of either or both of the seventh primary and seventh secondary adhesive layers AL7-1 and AL7-2 increases, a distance between the first support plate PLT1 and the digitizer DGT may increase.

Thus, the folding part FP may droop downward toward the digitizer DGT, and the folding segment FS of the electronic panel EP may droop downward. Thus, wrinkles may occur on the electronic panel EP, and thus, the wrinkles may be visually recognized by a user.

The electronic apparatus ED according to an embodiment of the inventive concept, such as but not limited to that shown in FIG. 1, may include a first support plate PLT1 in which the first folding groove EOP1 is defined. The first folding adhesive layer FPS1 and the first cover layer TPU1 may be disposed in the first folding groove EOP1. When a thickness of either or both of the first folding adhesive layer FPS1 and the first cover layer TPU1 increases, a depth of the first folding groove EOP1 may increase. Thus, a bottom surface of the first cover layer TPU1 need not further protrude downward than a bottom surface of either or both of the first and second flat parts FLT1 and FLT2, and a thickness of the seventh primary and seventh secondary adhesive layers AL7-1 and AL7-2 need not increase.

Thus, the thicknesses of the first folding adhesive layer FPS1 and the first cover layer TPU1 increase to prevent foreign substances from being separated from the first folding adhesive layer FPS1 and the first cover layer TPU1. Therefore, the foreign substances may be prevented from being permeated into the openings OP, and the folding of the electronic apparatus ED, such as but not limited to that of FIG. 1, may be facilitated.

In addition, even if the thicknesses of the first folding adhesive layer FPS1 and the first cover layer TPU1 increase, the thicknesses of the seventh primary and seventh secondary adhesive layers AL7-1 and AL7-2 need not increase, and thus, a distance between the first support plate PLT1 and the digitizer DGT need not increase. Thus, the folding segment FS of the electronic panel EP need not droop downward. Therefore, wrinkles in the electronic panel EP may be prevented from occurring, and a surface quality of the electronic apparatus ED, such as but not limited to that shown in FIG. 1, may be improved.

Referring to FIG. 9A, a cushion layer CUS may be disposed under the digitizer DGT. The cushion layer CUS may be separated into two on the folding segment FS. The cushion layer CUS may include a first cushion layer CUS1 disposed under the first non-folding segment NFS1 and a second cushion layer CUS2 disposed under the second non-folding segment NFS2. When viewed in the plan view, the first cushion layer CUS1 may overlap the first non-folding segment NFS1. When viewed in the plan view, the second cushion layer CUS2 may overlap the second non-folding segment NFS2.

The cushion layer CUS may protect the electronic panel EP from an impact transmitted from the lower side. For example, the cushion layer CUS may include foam or sponge. The foamed foam may include polyurethane foam or thermoplastic polyurethane foam. When the cushion layer CUS includes the foam, a barrier film may be added as a base layer, and a foaming agent may be foamed on the barrier film to form the cushion layer CUS.

The eighth adhesive layer AL8 may be disposed under the cushion layer CUS. The eighth adhesive layer AL8 may be divided into two on the folding segment FS. The eighth adhesive layer AL8 may include an eighth primary adhesive layer AL8-1 disposed below the first cushion layer CUS1 and an eighth secondary adhesive layer AL8-2 disposed below the second cushion layer CUS2. When viewed in the plan view, the eighth primary adhesive layer AL8-1 may overlap the first non-folding segment NFS1. When viewed in the plan view, the eighth secondary adhesive layer AL8-2 may overlap the second non-folding segment NFS2.

The second support plate PLT2 and the cushion layer CUS, which shall be described later, may be bonded to each other by the eighth adhesive layer AL8.

The second support plate PLT2 may be disposed below the cushion layer CUS. The second support plate PLT2 may be directly disposed on the bottom surfaces of the 8-first adhesive layer AL8-1 and the 8-second adhesive layer AL8-2.

The second support plate PLT2 may be divided into two portions on the folding segment FS. For example, when viewed in the plan view, the second support plate PLT2 may include a second primary support plate PLT2-1 overlapping the first non-folding segment NFS1 and a second secondary support plate PLT2-2 overlapping the second non-folding segment NFS2.

The second primary support plate PLT2-1 may support the first non-folding segment NFS1. The second secondary support plate PLT2-2 may support the second non-folding segment NFS2. The second primary support plate PLT2-1 and the second secondary support plate PLT2-2 may extend to the folding segment FS and be disposed adjacent to each other on the folding segment FS.

The second primary support plate PLT2-1 and the second secondary support plate PLT2-2 may be spaced apart from each other under the folding segment FS. For example, a distance between the second primary support plate PLT2-1 and the second secondary support plate PLT2-2 in the horizontal direction may be about 0.4 mm to about 2 mm.

The second primary support plate PLT2-1 and the second secondary support plate PLT2-2 may support a portion of the first support plate PLT1, in which the openings OP are defined, under the folding segment FS. For example, when a pressure is applied to the first support plate PLT1 from the upper side, the portion of the first support plate PLT1, in which the openings OP are defined, may be prevented from being deformed by the second primary support plate PLT2-1 and the second secondary support plate PLT2-2. Thus, each of the second primary and second secondary support plates PLT2-1 and PLT2-2 may perform a heat dissipation function.

The second support plate PLT2 may have rigid greater than that of the display part DSP. The second support plate PLT2 may include a non-metal material such as carbon fiber reinforced plastic, but the non-metal material of the second support plate PLT2 is not limited thereto. Moreover, embodiments of the inventive concept are not limited thereto, and the second support plate PLT2 may include a metal material such as stainless steel.

For example, the elastic modulus of the second support plate PLT2 may be 20 GPa to 190 GPa. Moreover, a thickness of the second support plate PLT2 may be about 50 micrometers.

A thickness of the first support plate PLT1 may be greater than that of the digitizer DGT. The thickness of the digitizer DGT may be greater than that of the second support plate PLT2. The seventh adhesive layer AL7 and the eighth adhesive layer AL8 may have substantially the same thickness. A thickness of the cushion layer CU may be less than that of either or both of the seventh and eighth adhesive layers AL7 and AL8.

The first and second support plates PLT1 and PLT2 and the seventh adhesive layer AL7 may have substantially the same width. The digitizer DGT, the cushion layer CUS, and the eighth adhesive layer AL8 may have substantially the same width as each other.

Widths of the first and second support plates PLT1 and PLT2 and the seventh adhesive layer AL7 may be disposed outside edges of the digitizer DGT, the cushion layer CUS, and the eighth adhesive layer AL8.

Referring to FIGS. 9A and 9B, the panel protective layer PPL and the fourth adhesive layer AL4 need not be disposed under the bending area BA. The panel protective layer PPL and the fourth adhesive layer AL4 may be disposed under the second area AA2 of the electronic panel EP. The data driver DDV may be disposed on the second area AA2 of the electronic panel EP.

The display device DD may include a printed circuit board (PCB). The printed circuit board PCB may be connected to the second area AA2 of the electronic panel EP. The printed circuit board PCB may be connected to one side of the second area AA2. The bending area BA may be bent so that the second area AA2 is disposed under the first area AA1. Thus, the data driver DDV and the printed circuit board PCB may be disposed under the first area AA1.

Figure 12:
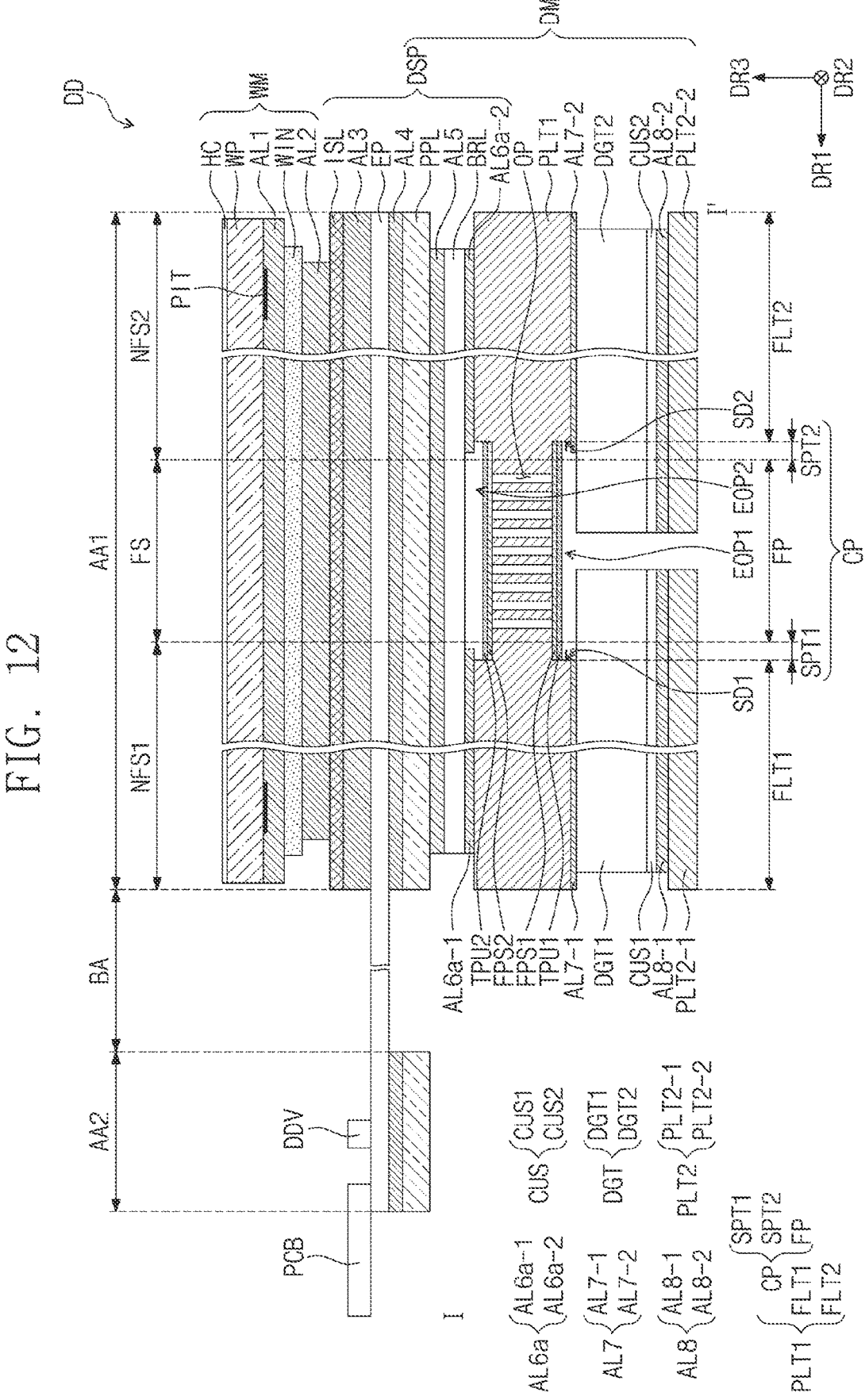
FIG. 12 is a cross-sectional view diagram taken along line I-I' of FIG. 7 according to an embodiment of the inventive concept.

FIG. 12 illustrates a cross-sectional view taken along line I-I' of FIG. 7 according to an embodiment of the inventive concept.

In the window module WM of FIG. 12, a display unit DSP, a digitizer DGT, a cushion layer CUS, a second support plate PLT2, a data driver DDV, a printed circuit board PCV, a first folding groove EOP1, a first cover layer TPU1, a first folding adhesive layer FPS1, a seventh adhesive layer AL7, and an eighth adhesive layer AL8 may be substantially the same as the display part DSP, the digitizer DGT, the cushion layer CUS, the second support plate PLT2, the data driver DDV, the printed circuit board PCV, the first folding groove EOP1, the first cover layer TPU1, the first folding adhesive layer FPS1, the seventh adhesive layer AL7, and the eighth adhesive layer AL8, and substantially duplicate description thereof may be simplified or omitted.

Referring to FIG. 12, a height of a bottom surface of the central part CP may be greater than that of either or both of a bottom surface of either or both of the first and second flat parts FLT1 and FLT2. A height of a top surface of the central part CP may be less than that of the top surface of either or both of the first and second flat parts FLT1 and FLT2. A thickness of the central part CP may be less than that of either or both of the first and second flat parts FLT1 and FLT2.

The central part CP may include first and second sub-flat parts SPT1 and SPT2 and a folding part FP. A thickness of either or both of the first and second sub-flat parts SPT1 and SPT2 and a thickness of the folding part FP may be substantially the same.

For example, when the first support plate PLT1 is a metal support plate, the central part CP may have a thickness of about 150 micrometers, and the thickness of either or both of the first and second flat parts FLT1 and FLT2 may range from about 182 micrometers to about 206 micrometers.

For example, when the first support plate PLT1 includes a reinforcing fiber composite material, the central part CP may have a thickness of about 170 micrometers, and each of the first and second flat parts FLT1 and FLT2 may have a thickness of about 202 micrometers to about 226 micrometers.

A first folding groove EOP1 overlapping the central part CP may be defined in a bottom surface of the first support plate PLT1 due to the difference in thickness between the first and second flat parts FLT1 and FLT2 and the central part CP. A second folding groove EOP2 overlapping the central part CP may be defined in a top surface of the first support plate PLT2.

A bottom surface of the folding part FP and bottom surfaces of the first and second sub-flat parts SPT1 and SPT2 may be defined as substantially the same plane. A top surface of the folding part FP and top surfaces of the first and second sub-flat parts SPT1 and SPT2 may be defined as substantially the same plane.

A top surface of the foldable part FP and top surfaces of the first and second sub-flat parts SPT1 and SPT2 may be disposed below the top surfaces of the first and second flat parts FLT1 and FLT2.

The first folding adhesive layer FPS1 and the first cover layer TPU1 may be disposed in the first folding groove EOP1. Detailed descriptions thereof have been described in FIG. 9A, and substantially duplicate description thereof may be simplified or omitted.

The display device DD may further include a second folding adhesive layer FPS2 and a second cover layer TPU2. The second folding adhesive layer FPS2 may be disposed in the second folding groove EOP2. The second folding adhesive layer FPS2 may be directly disposed on the top surface of the central part CP. The second folding adhesive layer FPS2 may be disposed on the top surfaces of the folding part FP and the first and second sub-flat parts SPT1 and SPT2. The second folding adhesive layer FPS2 may overlap the openings OP. For example, the second folding adhesive layer FPS2 may have a thickness of about 8 micrometers, without limitation thereto.

The second cover layer TPU2 may be disposed in the second folding groove EOP2. The second cover layer TPU2 may be disposed on the top surface of the central part CP. The second cover layer TPU2 may be disposed on the top surfaces of the folding part FP and the first and second sub-flat parts SPT1 and SPT2. The second cover layer TPU2 may be directly disposed on the top surface of the second folding adhesive layer FPS2.

The second cover layer TPU2 may overlap the folding segment FS. An edge of the second cover layer TPU2 may overlap the first and second non-folding segments NFS1 and NFS2.

The second folding adhesive layer FPS2 may be disposed between the second cover layer TPU2 and the top surface of the folding part FP and between the second cover layer TPU2 and the top surfaces of the first and second sub-flat parts SPT1 and SPT2.

The sum of the thickness of the second folding adhesive layer FPS2 and the thickness of the second cover layer TPU2 may be less than a depth of the second folding groove EOP2. The depth of the second folding groove EOP2 may be defined as a difference in height between the top surface of either or both of the first and second flat parts FLT1 and FLT2 and the top surface of the central part CP.

Thus, the top surface of the second cover layer TPU2 need not further protrude upward than the top surface of either or both of the first and second flat parts FLT1 and FLT2.

The second cover layer TPU2 may be disposed on the first support plate PLT1 to cover the openings OP defined in the first support plate PLT1. The first cover layer TPU1 may block moisture and/or foreign substances from being introduced into the openings OP defined in the first support plate PLT1.

The second cover layer TPU2 may have an elastic modulus less than that of the first support plate PLT1. For example, the second cover layer TPU2 may include thermoplastic polyurethane or rubber, but the material of the second cover layer TPU2 is not limited thereto. The second cover layer TPU2 may be manufactured in the form of a sheet and attached to the first support plate PLT1.

A sixth adhesive layer AL6a may be disposed on the first support plate PLT1. The sixth adhesive layer AL6a may be defined as a first upper adhesive layer AL6a.

The first upper adhesive layer AL6a may be disposed between the first support plate PLT1 and the barrier layer BRL. The first upper adhesive layer AL6a may be separated into two on the non-folding segments NFS1 and NFS2. The first upper adhesive layer AL6a may include a sixth primary adhesive layer AL6a-1 disposed on the first flat part FLT1 and a sixth secondary adhesive layer AL6a-2 disposed on the second flat part FLT2.

When viewed in the plan view, the sixth primary adhesive layer AL6a-1 may overlap the first non-folding segment NFS1. When viewed in the plan view, the sixth secondary adhesive layer AL6a-2 may overlap the second non-folding segment NFS2. The sixth primary adhesive layer AL6a-1 and the sixth secondary adhesive layer AL6a-2 may be spaced apart from each other in the first direction DR1.

The sixth primary adhesive layer AL6a-1 may extend onto the first sub-flat part SPT1. The sixth primary adhesive layer AL6a-1 may overlap the first sub-flat part SPT1. The sixth secondary adhesive layer AL6a-2 may extend onto the second sub-flat part SPT2. The sixth secondary adhesive layer AL6a-2 may overlap the second sub-flat part SPT2.

The sixth primary adhesive layer AL6a-1 and the sixth secondary adhesive layer AL6a-2 need not overlap the folding segment FS. The sixth primary adhesive layer AL6a-1 and the sixth secondary adhesive layer AL6a-2 need not overlap the folding part FP.

The sixth primary adhesive layer AL6a-1 and the sixth secondary adhesive layer AL6a-2 may be spaced apart from the second cover layer TPU2 in the third direction DR3. Each of the sixth primary adhesive layer AL6a-1 and the sixth secondary adhesive layer AL6a-2 may overlap the edge of the second cover layer TPU2.

Figure 13:
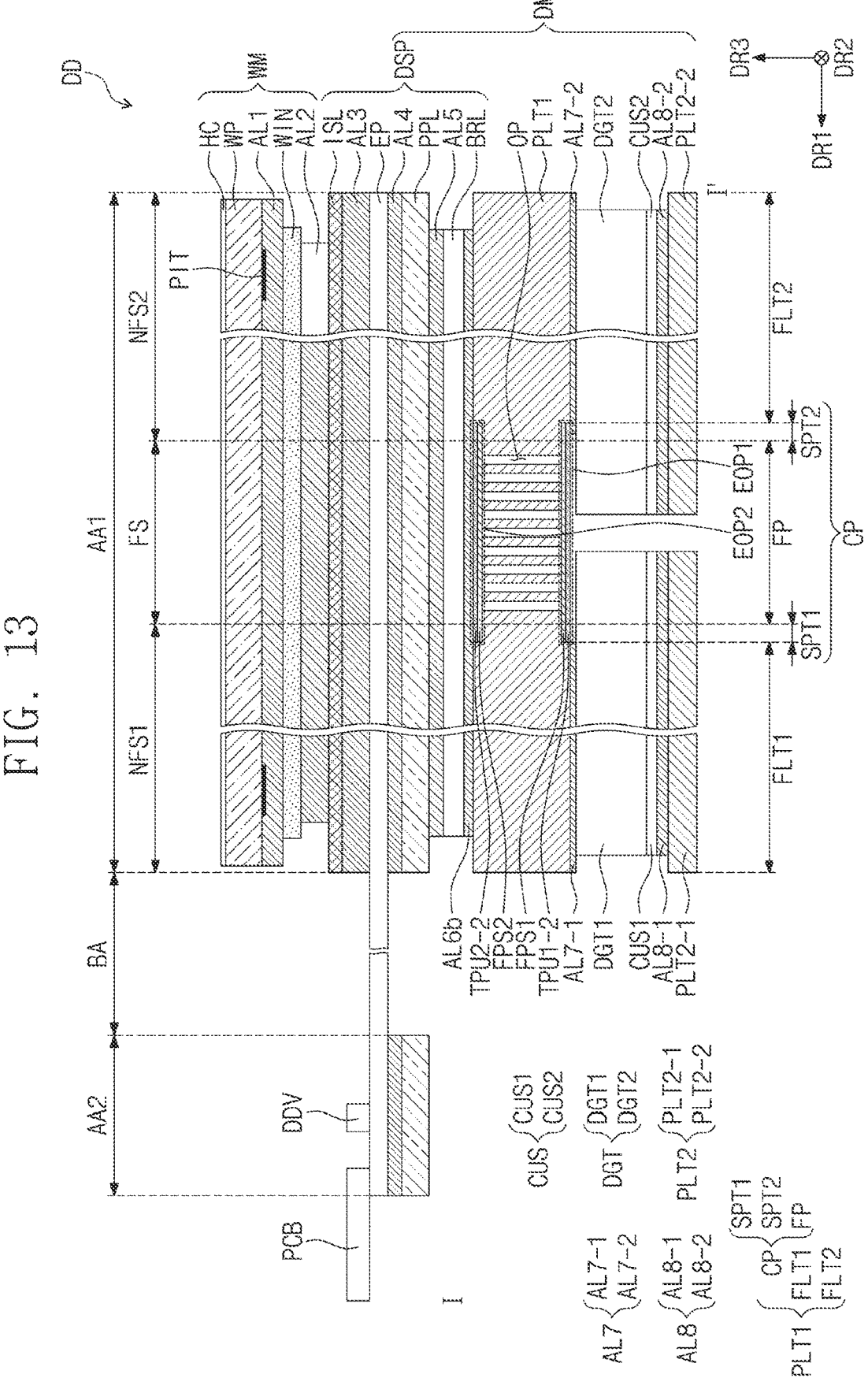
FIG. 13 is a cross-sectional view diagram taken along line I-I' of FIG. 7 according to an embodiment of the inventive concept.

FIG. 13 illustrates a cross-sectional view taken along line I-I' of FIG. 7 according to an embodiment of the inventive concept.

A window module, a display part DSP excluding a sixth adhesive layer AL6b, a digitizer DGT, a cushion layer CUS, a second support plate PLT2, a data driver DDV, and a printed circuit board PCV in FIG. 13 are substantially the same as the window module WM, the display unit DSP excluding the sixth adhesive layer AL6, the digitizer DGT, the cushion layer CUS, the second support plate PLT2, the data driver DDV, and the printed circuit board PCV in FIG. 9A, and substantially duplicate description thereof may be simplified or omitted.

A first secondary cover layer TPU1-2 and a first folding adhesive layer FPS1 in FIG. 13 are substantially the same as the first secondary cover layer TPU1-2 and the first folding adhesive layer FPS1 in FIG. 11, and substantially duplicate description thereof may be simplified or omitted.

A first folding groove EOP1, a first support plate PLT1, and a second folding groove EOP2 in FIG. 13 are substantially the same as the first folding groove EOP1, the first support plate PLT1, and the second folding groove EOP2 in FIG. 12, and substantially duplicate description thereof may be simplified or omitted.

The second folding adhesive layer FPS2 and the second secondary cover layer TPU2-2 may be disposed in the second folding groove EOP2. The second folding adhesive layer FPS2 may be disposed on a top surface of a central part CP. The second folding adhesive layer FPS2 may be disposed on a top surface of the folding part FP and top surfaces of the first and second sub-flat parts SPT1 and SPT2.

The second secondary cover layer TPU2-2 may be directly disposed on a top surface of the second folding adhesive layer FPS2. The second folding adhesive layer FPS2 may be disposed between a bottom surface of the second secondary cover layer TPU2-2 and the top surface of the central part CP. The second folding adhesive layer FPS2 may be disposed between the bottom surface of the second secondary cover layer TPU2-2 and the top surface of the folding part FP and between the bottom surface of the second secondary cover layer TPU2-2 and the top surfaces of the first and second sub-flat parts SPT1 and SPT2.

The sum of a thickness of the second folding adhesive layer FPS2 and the thickness of the second secondary cover layer TPU2-2 may be equal to a depth of the second folding groove EOP2. The depth of the second folding groove EOP2 may be defined as a difference between a height of the central part CP and a height of either or both of the first and second flat parts FLT1 and FLT2. Thus, a height of the top surface of the second secondary cover layer TPU2-2 may be substantially the same as that of either or both of the top surfaces of the first and second flat parts FLT1 and FLT2.

The sixth adhesive layer AL6b may be disposed on the first support plate PLT1. The sixth adhesive layer AL6b may be defined as a second upper adhesive layer AL6b. The second upper adhesive layer AL6b may be disposed between the first support plate PLT1 and the barrier layer BRL. The first support plate PTL1 and the barrier layer BRL may be bonded to each other by the second upper adhesive layer AL6b.

The second upper adhesive layer AL6b may extend in the first direction DR1 from the top surface of the first flat part FLT1 toward the top surface of the second flat part FLT2. The second upper adhesive layer AL6b may overlap first and second non-folding segments NFS1 and NFS2 and a folding segment FS. The second upper adhesive layer AL6b may overlap the first and second flat parts PLT1 and PLT2 and the folding part FP.

The second upper adhesive layer AL6b may cover an openings OP defined in the folding part FP. The second upper adhesive layer AL6b may cover the second secondary cover layer TPU2-2. The bottom surface of the second upper adhesive layer AL6b may be in direct contact with the top surface of the second secondary cover layer TPU2-2.

A width of the second upper adhesive layer AL6b in the first direction DR1 may be substantially the same as that of the barrier layer BRL.

Figure 14:
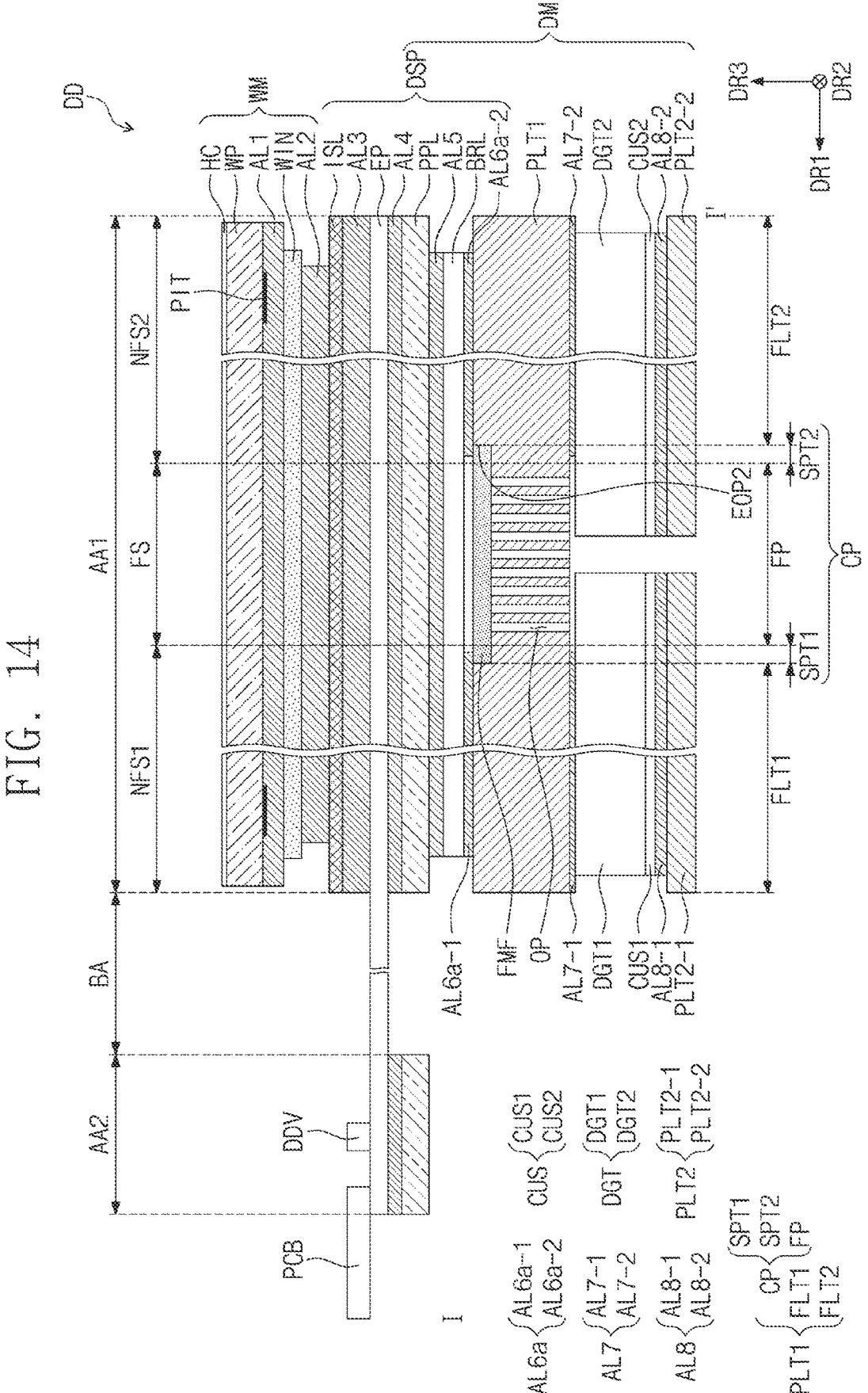
FIG. 14 is a cross-sectional view diagram taken along line I-I' of FIG. 7 according to an embodiment of the inventive concept.

FIG. 14 illustrates a cross-sectional view taken along line I-I' of FIG. 7 according to an embodiment of the inventive concept.

A window module, a display part DSP, a digitizer DGT, a cushion layer CUS, a second support plate PLT2, a data driver DDV, and a printed circuit board PCV in FIG. 14 are substantially the same as the window module WM, the display unit DSP, the digitizer DGT, the cushion layer CUS, the second support plate PLT2, the data driver DDV, and the printed circuit board PCV in FIG. 9A, and substantially duplicate description thereof may be simplified or omitted.

Since a sixth adhesive layer AL6a of FIG. 14 is substantially the same as the sixth adhesive layer AL6a of FIG. 12, substantially duplicate description thereof may be simplified or omitted.

Referring to FIG. 14, bottom surfaces of first and second flat parts FLT1 and FLT2 and a bottom surface of a central part CP may have substantially the same height. A thickness of either or both of the first and second flat parts FLT1 and FLT2 and a thickness of the central part CP may be different from each other. For example, the thickness of the central part CP may be less than that of either or both of the first and second flat parts FLT1 and FLT2. Thus, a height of the top surface of the central part CP may be less than that of either or both of the top surfaces of the first and second flat parts FLT1 and FLT2.

The central part CP may include first and second sub-flat parts SPT1 and SPT2 and a folding part FP. A thickness of either or both of the first and second sub-flat parts SPT1 and SPT2 and a thickness of the folding part FP may be substantially the same.

A second folding groove EOP2 may be defined due to a difference in thickness between the central part CP and the first and second flat parts FLT1 and FLT2. The second folding groove EOP2 may be defined in a top surface of the first support plate PLT1 overlapping the central part CP.

The second folding groove EOP2 may overlap the first and second sub-flat parts SPT1 and SPT2 and the folding part FP.

The display device DD may further include a fragment part FMF. The fragment part FMF may be disposed in the second folding groove EOP2. The fragment part FMF may be disposed on the top surface of the central part CP. The fragment part FMF may be disposed on the top surfaces of the first and second sub-flat parts SPT1 and SPT2 and the top surfaces of the folding part FP. The fragment part FMF may cover the openings OP.

A width of the fragment part FMF in the first direction DR1 may be substantially the same as that of the second folding groove EOP2 in the first direction DR1. A thickness of the fragment part FMF may be substantially the same as a depth of the second folding groove EOP2. Thus, a height of the top surface of the fragment part FMF may be substantially the same as that of either or both of the top surfaces of the first and second flat parts FLT1 and FLT2. A thickness of the second folding groove EOP2 may be defined as a difference between the height of either or both of the top surfaces of the first and second flat parts FLT1 and FLT2 and the height of the top surface of the central part CP.

The fragment part FMF may be a film having a high elastic limit. For example, the fragment part FMF may include a flexible plastic material. The fragment part FMF may include polyethylene terephthalate (PET).

A sixth adhesive layer AL6a may be disposed on the first support plate PLT1. The sixth adhesive layer AL6a may be defined as a first upper adhesive layer AL6a.

The first upper adhesive layer AL6a may be disposed between the first support plate PLT1 and the barrier layer BRL. The first upper adhesive layer AL6a may be separated into two on the non-folding segments NFS1 and NFS2. The first upper adhesive layer AL6a may include a sixth primary adhesive layer AL6a-1 disposed on the first flat part FLT1 and a sixth secondary adhesive layer AL6a-2 disposed on the second flat part FLT2.

The sixth secondary adhesive layer AL6a-2 may extend from an upper portion of the second flat part FLT2 to an upper portion of the second sub-flat part SPT2. The sixth secondary adhesive layer AL6a-2 may overlap the second flat part FLT2 and the second sub-flat part SPT2. The sixth secondary adhesive layer AL6a-2 may overlap an edge of the fragment part FMF, which is adjacent to the second flat part FLT2.

Figure 15:
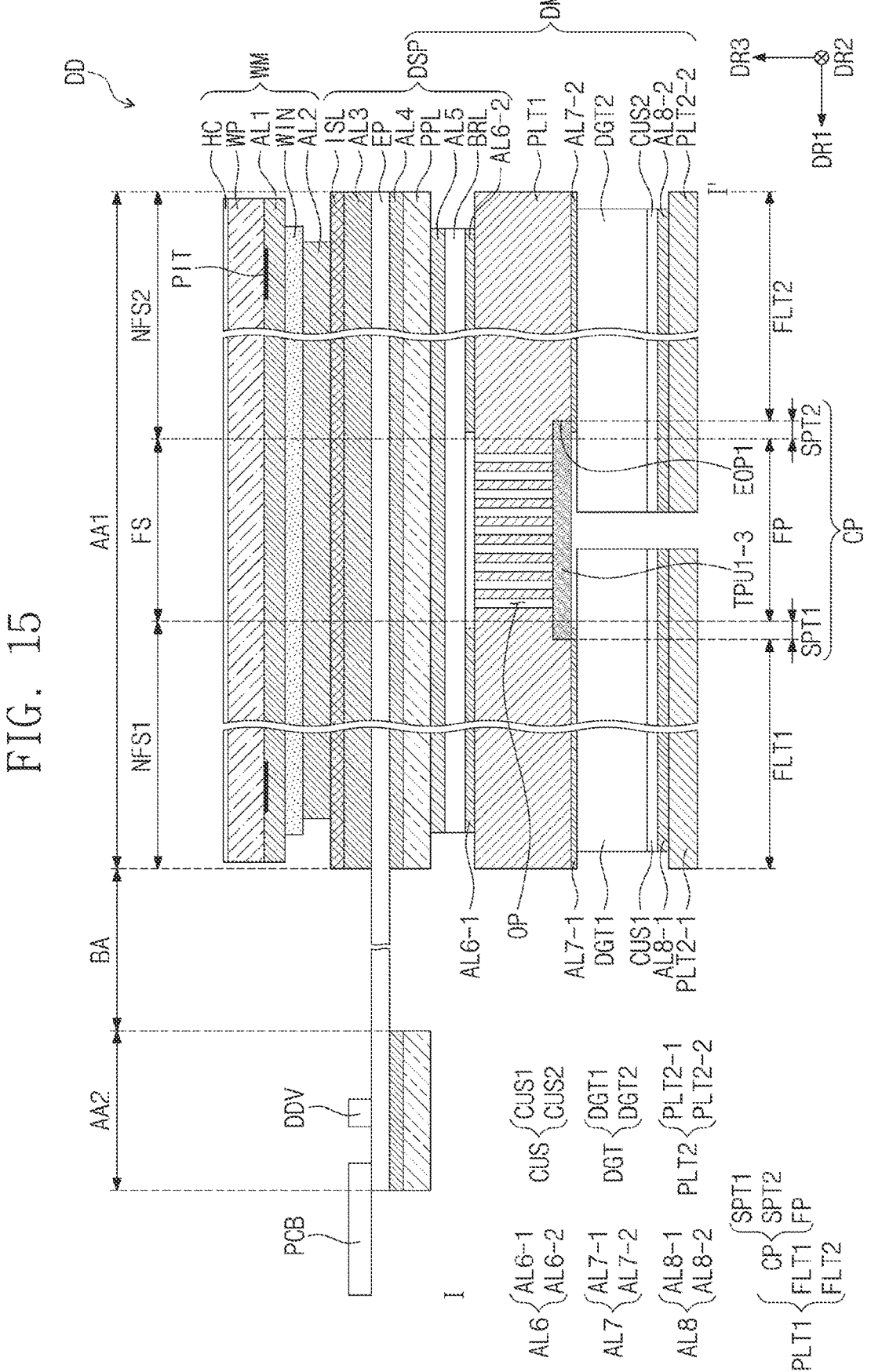
FIG. 15 is a cross-sectional view diagram taken along line I-I' of FIG. 7 according to an embodiment of the inventive concept.

FIG. 15 illustrates a cross-sectional view taken along line I-I' of FIG. 7 according to an embodiment of the inventive concept.

A window module WM, a display part DSP, a first support plate PLT1, a digitizer DGT, a cushion layer CUS, an eighth adhesive layer AL8, a second support plate PLT2, and a first folding groove EOP1 in FIG. 15 are substantially the same as the window module WM, the display part DSP, the first support plate PLT1, the digitizer DGT, the cushion layer CUS, the eighth adhesive layer AL8, the second support plate PLT2, and the first folding groove EOP1 in FIG. 9A, and substantially duplicate description thereof may be simplified or omitted.

Referring to FIG. 15, a first tertiary cover layers TPU1-3 may be disposed in the first folding groove EOP1. The first tertiary cover layers TPU1-3 may be directly disposed below a bottom surface of a central part CP.

The first tertiary cover layers TPU1-3 may be disposed below a bottom surface of a folding part FP and a bottom surface of either or both of first and second sub-flat parts SPT1 and SPT2.

A thickness of the first tertiary cover layers TPU1-3 may be substantially the same as a depth of the first folding groove EOP1. Thus, a bottom surface of the first tertiary cover layer TPU1-3 may be disposed at substantially the same as that of a bottom surface of either or both of the first and second flat parts FLT1 and FLT2.

A seventh adhesive layer AL7 may be disposed below the first support plate PLT1. The seventh adhesive layer AL7 may be defined as a lower adhesive layer. The seventh adhesive layer AL7 may include a seventh primary adhesive layer AL7-1 overlapping a first non-folding segment NFS1 and a seventh secondary adhesive layer AL7-2 overlapping a second non-folding segment NFS2. The seventh primary adhesive layer AL7-1 and the seventh secondary adhesive layer AL7-2 need not overlap the folding segment FS.

The seventh primary adhesive layer AL7-1 may extend along the bottom surface of the first flat part FLT1 to a bottom surface of a first tertiary cover layer TPU1-3 in the first direction DR1. The seventh primary adhesive layer AL7-1 may overlap the first flat part FLT1 and the first sub-flat part SPT1. The seventh primary adhesive layer AL7-1 need not overlap the folding part FP.

The seventh primary adhesive layer AL7-1 may overlap an edge of the first tertiary cover layer TPU1-3. The bottom surface of the first tertiary cover layer TPU1-3 may be directly disposed on a top surface of the seventh primary adhesive layer AL7-1.

The seventh secondary adhesive layer AL7-2 may extend along the bottom surface of the second flat part FLT2 to the bottom surface of the first tertiary cover layer TPU1-3 in the first direction DR1. The seventh secondary adhesive layer AL7-2 may overlap the second flat part FLT2 and the second sub-flat part SPT2. The seventh secondary adhesive layer AL7-2 need not overlap the folding part FP.

The seventh secondary adhesive layer AL7-2 may overlap an edge of the first tertiary cover layer TPU1-3. The bottom surface of the first tertiary cover layer TPU1-3 may be directly disposed on a top surface of the seventh secondary adhesive layer AL7-2.

According to this structure, the first tertiary cover layer TPU1-3 may be bonded to the seventh adhesive layer AL7 without the first folding adhesive layer FPS1, such as but not limited to that shown in FIG. 9A, and then be disposed in the first folding groove EOP1.

According to embodiments of the inventive concept, the folding groove may be defined in the bottom surface of the support plate. The cover layer may be disposed in the folding groove. According to this structure, even if the thickness of the cover layer increases, the distance of the stepped portion between the support plate and the digitizer disposed under the support plate need not increase, and the wrinkles of the display module due to the stepped portion between the support plate and the digitizer may be prevented from being visually recognized by the user.

In addition, as the thickness of the cover layer increases, foreign substances separated from the cover layer of the display device may be prevented from penetrating into openings defined in the support plate.

Those of ordinary skill in the pertinent art will appreciate that various modifications and variations can be made in embodiments of the inventive concept. Thus, it is intended that the present disclosure cover all of the modifications and variations of this inventive concept that come within the scope of the appended claims and equivalents thereof. Thus, to the maximum extent allowed by law, the scope of the inventive concept is to be determined by the broadest permissible interpretation of the following claims and their equivalents, and shall not be restricted or limited by the foregoing detailed description by way of example.

What is claimed is:

1. A display device comprising:
   a display panel;
   a support plate disposed below the display panel, the support plate comprising a first flat part, a second flat part, and a folding part disposed between the first and second flat parts;
   a first cover layer disposed in a first folding groove defined in a bottom surface of the support plate overlapping the folding part; and
   a first lower adhesive layer disposed on the bottom surface of the support plate, the first lower adhesive layer comprising a first lower primary adhesive layer and a first lower secondary adhesive layer,
   wherein the folding part has a thickness different than each of the first and second flat parts, the first lower primary adhesive layer overlaps a first edge portion of the first cover layer adjacent to the first flat part, and the first lower secondary adhesive layer overlaps a second edge portion of the first cover layer adjacent to the second flat part.

2. The display device of claim 1, wherein the first and second flat parts are arranged in a first direction, wherein a bottom surface of the folding part is disposed higher than bottom surfaces of the first and second flat parts.

3. The display device of claim 2, wherein the support plate comprises:

a first sub-flat part disposed between the first flat part and the folding part; and a second sub-flat part disposed between the second flat part and the folding part, wherein each of the first and second sub-flat parts has substantially the same thickness as the folding part, and the bottom surface of the folding part and the bottom surfaces of the first and second sub-flat parts are defined in substantially the same plane.

4. The display device of claim 1, further comprising a first folding adhesive layer disposed between the first cover layer and the bottom surface of the folding part and between the first cover layer and the bottom surfaces of the first and second sub-flat parts.

5. The display device of claim 1, wherein the first cover layer protrudes no farther downward than the bottom surfaces of the first and second flat parts.

6. The display device of claim 1, wherein a bottom surface of the first cover layer is directly disposed on top surfaces of the first lower primary and secondary adhesive layers.

7. The display device of claim 3, wherein a top surface of the folding part and top surfaces of the first and second sub-flat parts are defined in substantially the same plane, and the top surface of the folding part and the top surfaces of the first and second sub-flat parts are disposed lower than top surfaces of the first and second flat parts.

8. The display device of claim 7, further comprising:

a second cover layer disposed on the top surface of the folding part and the top surfaces of the first and second sub-flat parts; and second folding adhesive layers disposed between the second cover layer and the top surface of the folding part and between the second cover layer and the top surfaces of the first and second sub-flat parts, wherein the second cover layer protrudes no farther upward than the top surfaces of the first and second flat parts.

9. The display device of claim 8, further comprising a first upper adhesive layer disposed on the top surfaces of the first and second flat parts, wherein the first upper adhesive layer is disposed on the second cover layer that overlaps the first and second sub-flat parts.

10. The display device of claim 1, wherein the first and second flat parts are arranged in a first direction, wherein a top surface of the folding part is disposed lower than top surfaces of the first and second flat parts.

11. The display device of claim 10, wherein the support plate comprises:

a first sub-flat part disposed between the first flat part and the folding part; and a second sub-flat part disposed between the second flat part and the folding part, wherein each of the first and second sub-flat parts has substantially the same thickness as the folding part, and the top surface of the folding part and the top surfaces of the first and second sub-flat parts are defined in substantially the same plane.

12. The display device of claim 11, further comprising a fragment part disposed on the top surface of the folding part and the top surfaces of the first and second sub-flat parts, wherein the fragment part comprises a flexible plastic material.

13. A display device comprising:

a display panel;

a support plate disposed below the display panel and comprising a first flat part, a second flat part, and a central part disposed between the first and second flat parts;

a first cover layer disposed in a first folding groove defined in a bottom surface of the support plate overlapping the central part; and a first lower adhesive layer disposed on the bottom surface of the support plate, the first lower adhesive layer comprising a first lower primary adhesive layer and a first lower secondary adhesive layer, wherein the first lower primary adhesive layer overlaps a first edge portion of the first cover layer adjacent to the first flat part, and the first lower secondary adhesive layer overlaps a second edge portion of the first cover layer adjacent to the second flat part.

14. The display device of claim 13, wherein the central part comprises:

a folding part in which a plurality of openings are defined;

a first sub-flat part without the openings which is disposed between the folding part and the first flat part; and a second sub-flat part without the openings which is disposed between the folding part and the second flat part.

15. The display device of claim 13, further comprising a first folding adhesive layer disposed between the central part and the first cover layer, wherein the first cover layer protrudes no farther downward than the bottom surfaces of the first and second flat parts, and wherein the first and second flat parts are arranged in a first direction.

16. The display device of claim 15, further comprising:

a second cover layer disposed in a second folding groove defined in a top surface of the support plate overlapping the central part; and a second folding adhesive layer disposed between the central part and the second cover layer, wherein the second cover layer protrudes no farther outward than the top surfaces of the first and second flat parts.

17. An electronic apparatus comprising:

a display device; and a power source configured to supply power to the display device, the display device comprising:

a display panel;

a support plate disposed under the display panel, the support plate comprising a first flat part, a second flat part, and a folding segment disposed between the first and second flat parts;

a plurality of openings defined in at least the folding segment of the support plate;

at least one cover layer disposed over the openings; and a first lower adhesive layer disposed on a bottom surface of the support plate, the first lower adhesive layer comprising a first lower primary adhesive layer and a first lower secondary adhesive layer, wherein the at least one cover layer is settled into the support plate, and wherein the folding segment of the support plate comprises an etched space for the at least one cover layer to settle, and the first lower primary adhesive layer overlaps a first edge portion of the at least one cover layer adjacent to the first flat part, and the first lower secondary adhesive layer overlaps a second edge portion of the same at least one cover layer adjacent to the second flat part.

18. The electronic apparatus of claim 17, wherein the folding segment is in-folded and out-folded at a substantially same first radius about a folding axis.

19. The display device of claim 13, wherein the central part is in-folded and out-folded at a substantially same first radius about a folding axis.

20. The display device of claim 1, wherein the folding part is in-folded and out-folded at a substantially same first radius about a folding axis.

\* \* \* \* \*